(12) United States Patent
Howland

(10) Patent No.: US 11,160,200 B2
(45) Date of Patent: Oct. 26, 2021

(54) FLEXIBLE AND FOLDABLE ELECTROMAGNETIC SHIELDING

(71) Applicant: Warwick Mills, Inc., New Ipswich, NH (US)

(72) Inventor: Charles A Howland, Temple, NH (US)

(73) Assignee: Warwick Mills, Inc., New Ipswich, NH (US)

(*) Notice: Subject to any disclaimer, the term of this patent is extended or adjusted under 35 U.S.C. 154(b) by 0 days.

(21) Appl. No.: 16/832,533

(22) Filed: Mar. 27, 2020

(65) Prior Publication Data

US 2020/0315072 A1    Oct. 1, 2020

Related U.S. Application Data

(60) Provisional application No. 62/824,444, filed on Mar. 27, 2019.

(51) Int. Cl.
*H05K 9/00* (2006.01)
*D06M 11/83* (2006.01)

(52) U.S. Cl.
CPC ........ *H05K 9/0084* (2013.01); *D06M 11/83* (2013.01); *H05K 9/009* (2013.01); *H05K 9/0088* (2013.01)

(58) Field of Classification Search
CPC .................................................. H05K 9/0084
See application file for complete search history.

(56) References Cited

U.S. PATENT DOCUMENTS

| | | |
|---|---|---|
| 3,486,177 A | 12/1969 | Marshack |
| 4,712,594 A | 12/1987 | Schneider |
| 4,982,959 A | 1/1991 | Rudell |
| 5,445,863 A | 8/1995 | Slagle et al. |
| 5,511,536 A | 4/1996 | Bussey, Jr. |
| 5,755,275 A | 5/1998 | Rose |

(Continued)

FOREIGN PATENT DOCUMENTS

| | | |
|---|---|---|
| EP | 0982801 A2 | 3/2000 |
| EP | 0742095 B1 | 2/2002 |
| JP | 2000167963 A | 6/2000 |

OTHER PUBLICATIONS

International Search Report and Written Opinion for Appl No. PCT/US2017/050467 dated Dec. 19, 2017, 15 pages.

(Continued)

*Primary Examiner* — Hung V Ngo

(74) *Attorney, Agent, or Firm* — Maine Cernota & Rardin

(57) ABSTRACT

A flexible, foldable EM barrier attenuates electromagnetic radiation by at least 20 dB from 1 GHz to 30 GHz. The barrier includes an LF layer that blocks EM radiation at least at low frequencies, laminated to a textile support layer that reduces stress cracking of the LF layer and prevents widening of any cracks that do form. Embodiments further include an HF layer that blocks EM radiation at high frequencies, such as a metallized polymer film and/or an elastomer layer filled with conductive particles. The LF layer can be foil, mesh, or electroless metallization of the support textile or of another textile. A thermal insulation layer can be included. A topcoat can block UV, and primer layers can resist moisture. Barriers can be joined to each other and/or to adjacent structures by lanyards, webbing, sewing, soft connections, and/or flex joints formed by adhesively attached metallized textiles or films.

32 Claims, 13 Drawing Sheets

(56) References Cited

U.S. PATENT DOCUMENTS

| | | | |
|---|---|---|---|
| 5,799,600 | A | 9/1998 | Reuben |
| 6,093,475 | A | 7/2000 | Geller |
| 9,276,324 | B2 | 3/2016 | Kelsey et al. |
| 2004/0162536 | A1 | 8/2004 | Becker |
| 2004/0213982 | A1 | 10/2004 | Touzov |
| 2009/0252913 | A1 | 10/2009 | Cincotti et al. |
| 2012/0148797 | A1 | 6/2012 | Tsai |
| 2014/0304883 | A1 | 10/2014 | Morag et al. |
| 2017/0002488 | A1 | 1/2017 | Tanaka et al. |
| 2017/0203479 | A1 | 7/2017 | Laurin et al. |
| 2018/0055118 | A1 | 3/2018 | Hafeez-Bey |
| 2019/0168486 | A1* | 6/2019 | Min .................. B32B 38/0036 |
| 2020/0080241 | A1* | 3/2020 | Ray ........................ D03D 15/43 |

OTHER PUBLICATIONS

Extended European Search Report for Application No. 17849525.5 dated Feb. 26, 2020, 6 pages.

International Preliminary Report on Patentability for Appl No. PCT/US2017/050467 dated Mar. 12, 2019, 10 pages.

"Learning Express Fiil-n-Fun Water Play Mat" (https://learningexpress.com/fill-n-fun-water-play-mat/) via Internet Wayback Machine https://web.archive.org/web/20150928220409/https:learningexpress.com/fill-n-fun-water-play-mat (Year: 2015).

Art 3d Colorful Dance Floor May Liquid Encased Floor Tile https://www.srt3d.com/designs/a11004-colorful-dance-floor-mat-liquid-encased-floor-tile-50cmx50cm/ (Review dated Mar. 11, 2016) (Year: 2016).

"Infantino Pat and Play Water Matt" (https://infantino.com/products/pat-play-water-mat) via Internet Wayback Machine hittps://web.archive.org/web/20150905143504/https://Infantino.com/products/pat-play-water-mat circa Sep. 5, 2015 (Year: 2015).

American Plating Company ("The 5 Most Conductive Metals on Earth Are . . . " http://www.americanplatingcompany.com/most-conductive-metals/, via Internet Wayback Machine May 12, 2016 (Year: 2016).

Smith ("What is PET?" by Johanna Smith, Huffpost 2008, https://www.huffpost.com/entry/what-is-pet_n_139440 (Year: 2008).

Jane ("Material Matters: Cotton Canvas" by Adam Jane, Aug. 10, 2016 https://www.sneakerfreaker.com/articles/material-matters-cotton-canvas/) (Year: 2016).

International Search Report and Written Opinion for PCT Appl. No. PCT/US2020/025230, dated Jul. 21, 2020, 12 Pages.

Office Action for U.S. Appl. No. 16/868,726 dated Jun. 1, 2021, 7 pages.

* cited by examiner

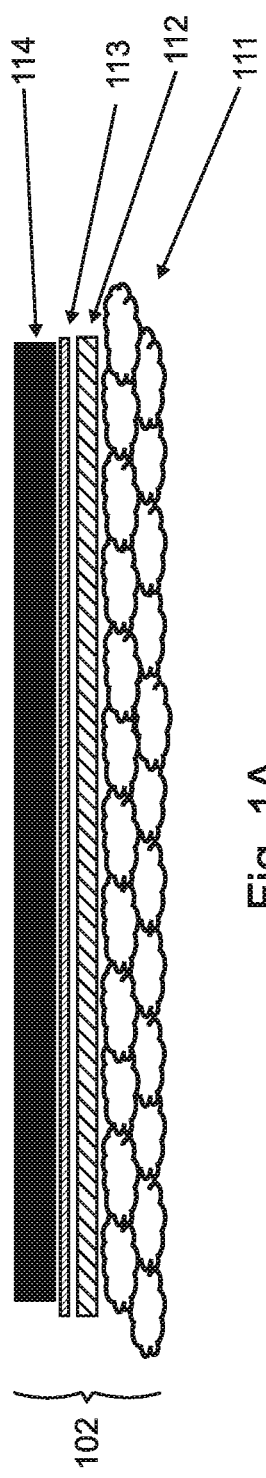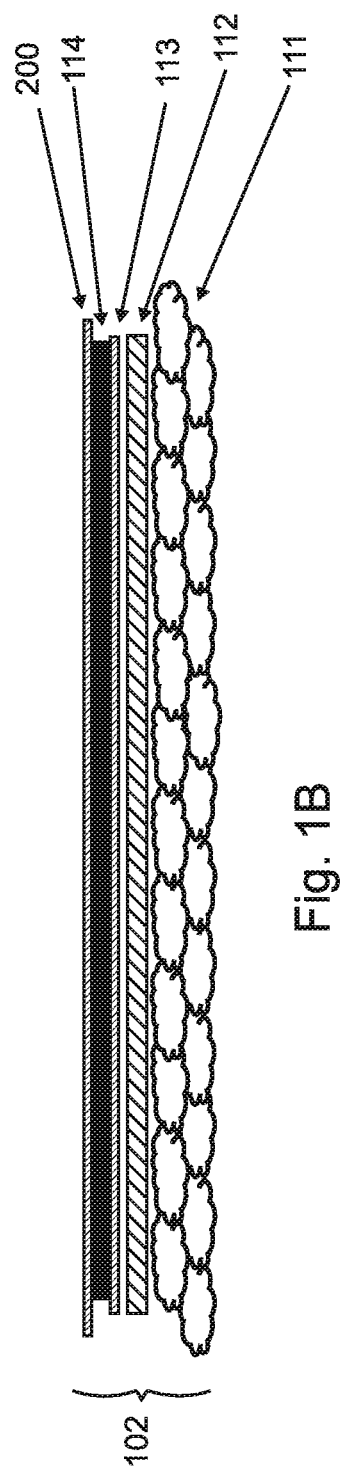

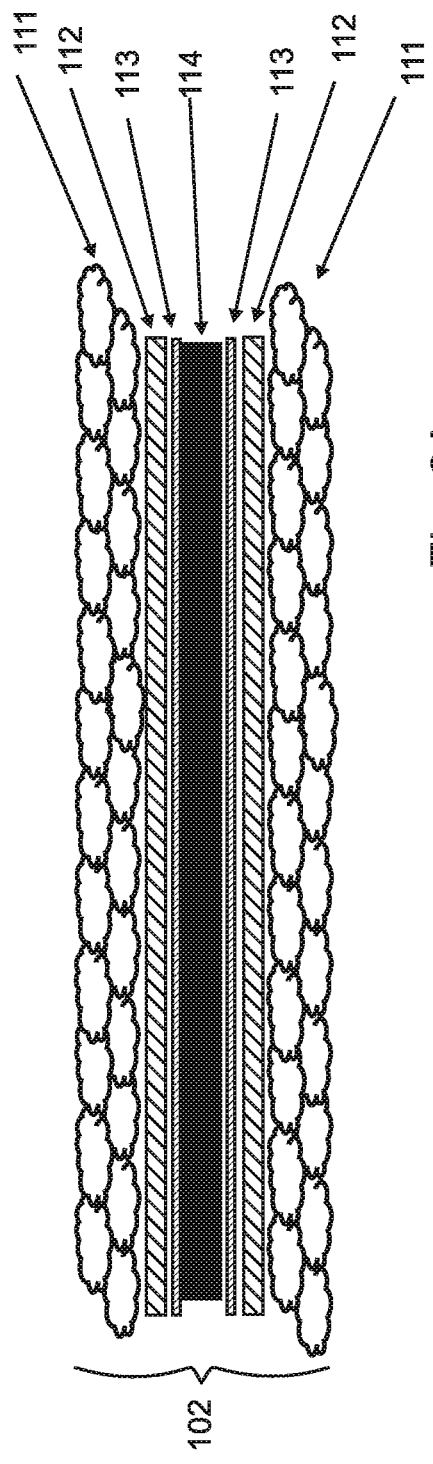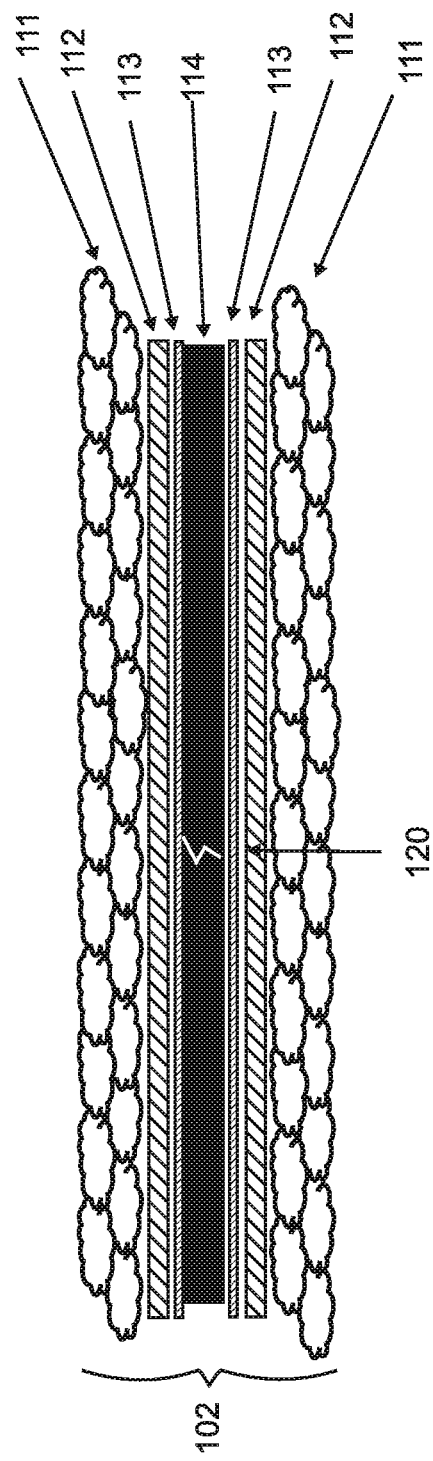

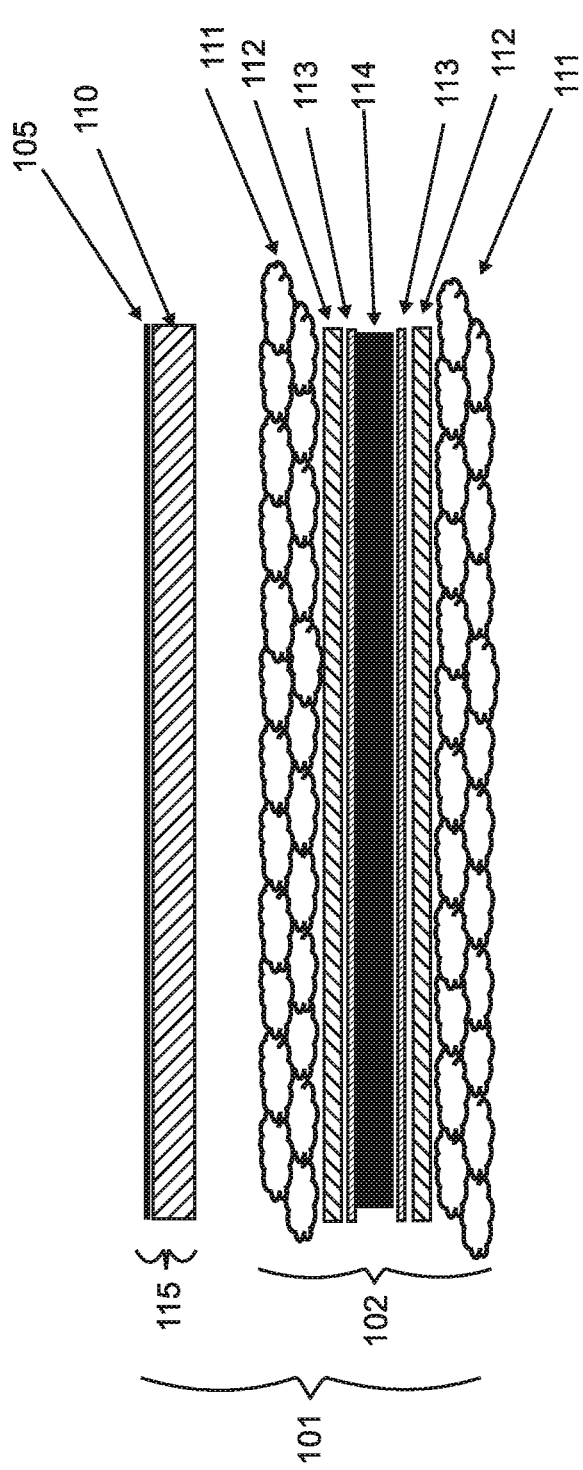
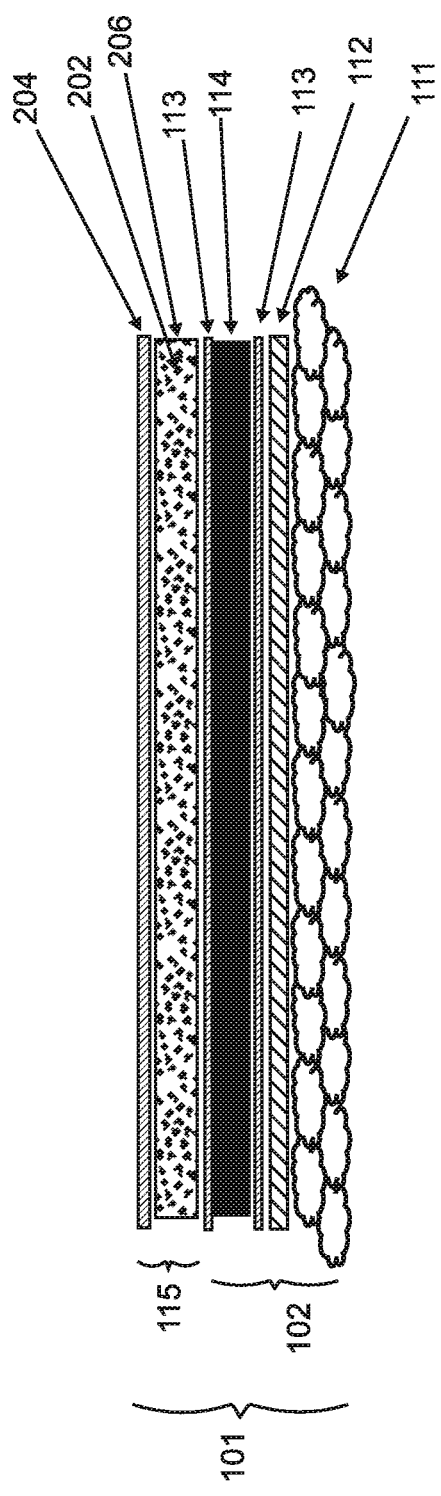
Fig. 3A
Fig. 3B

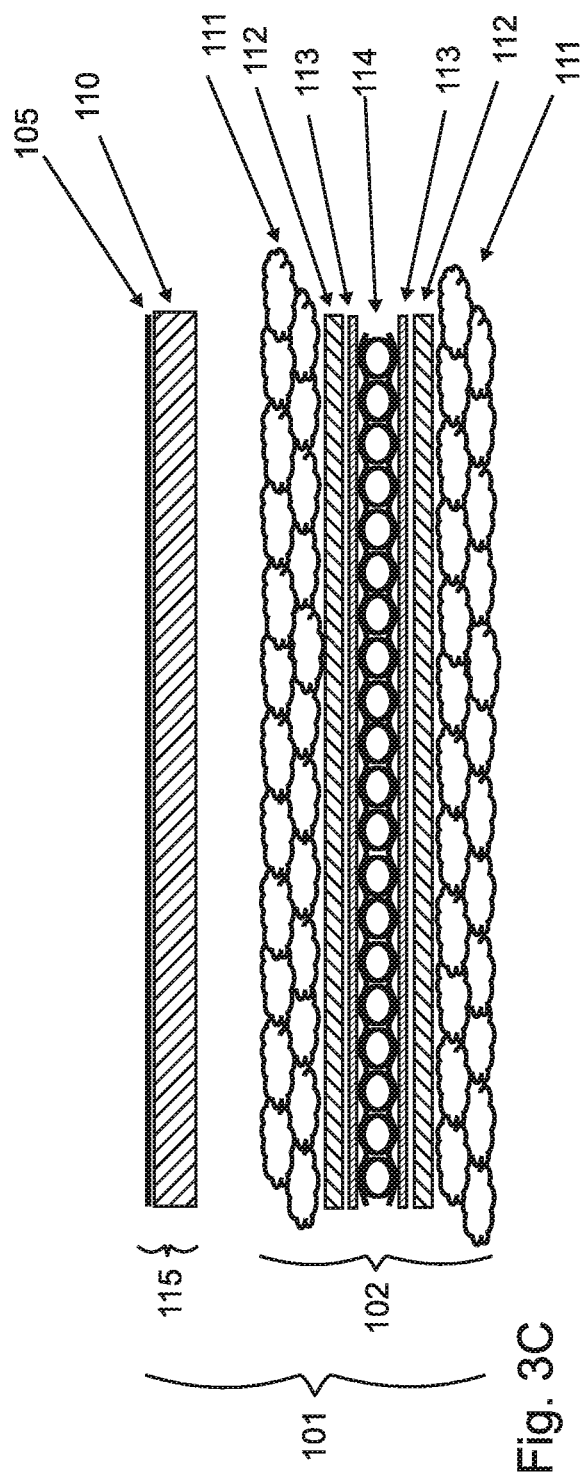
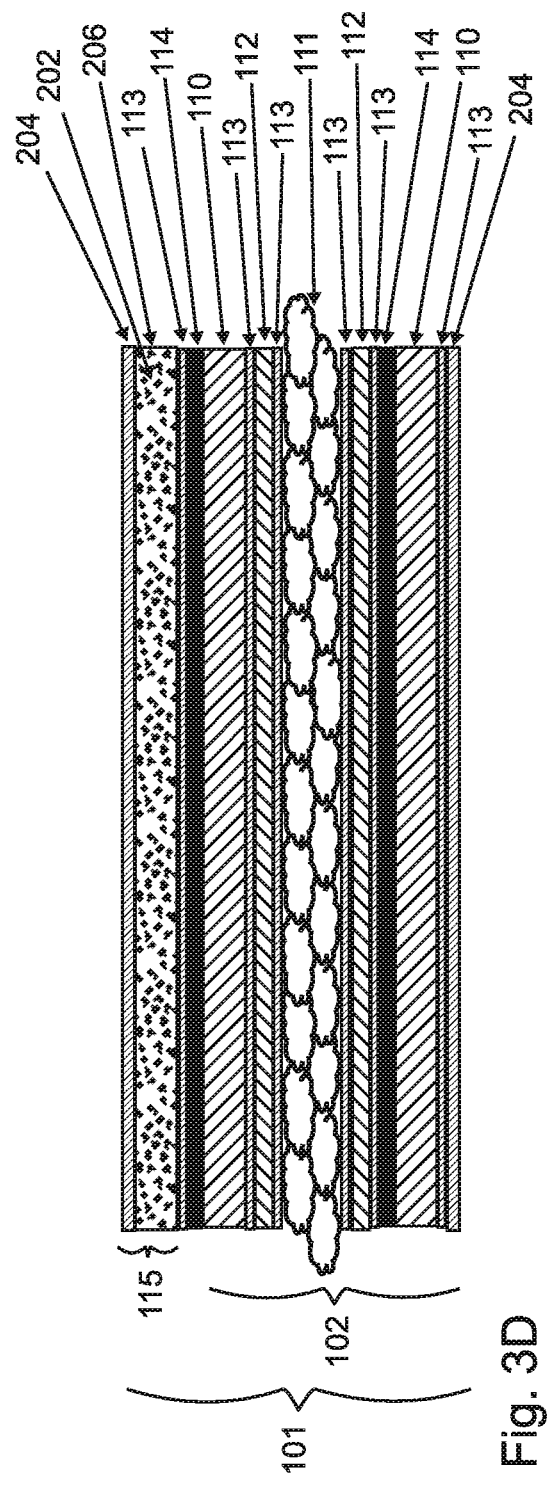

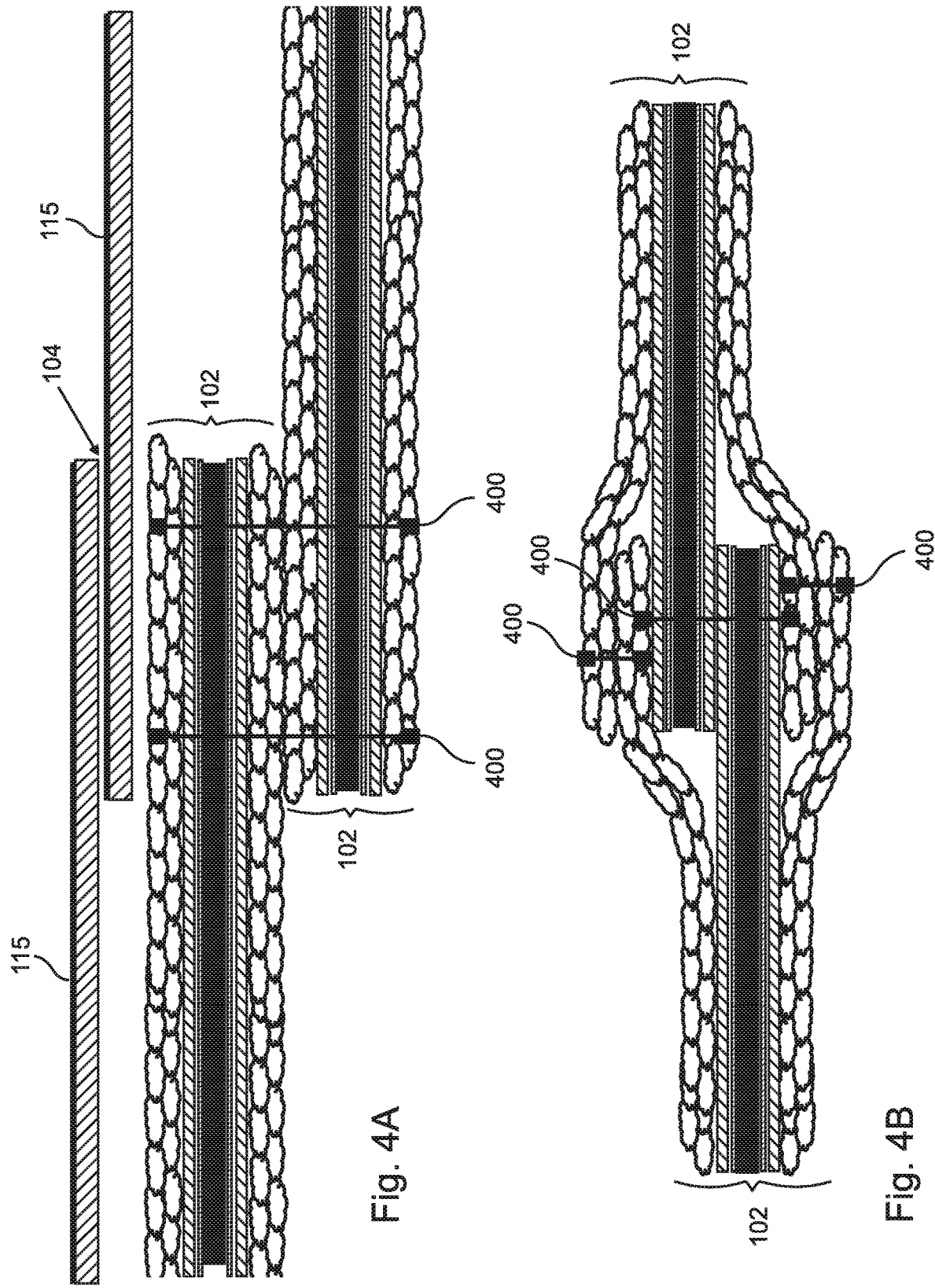

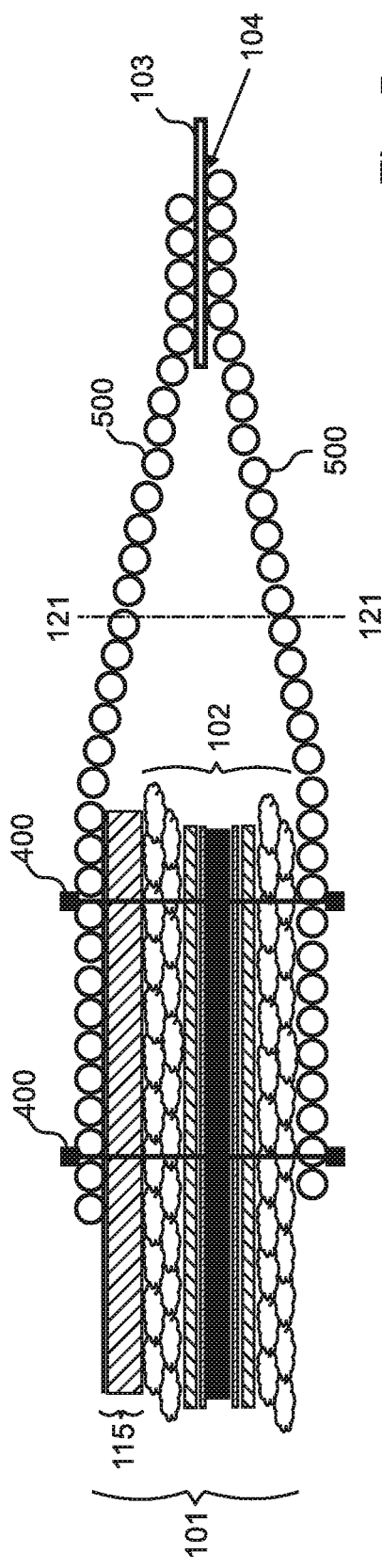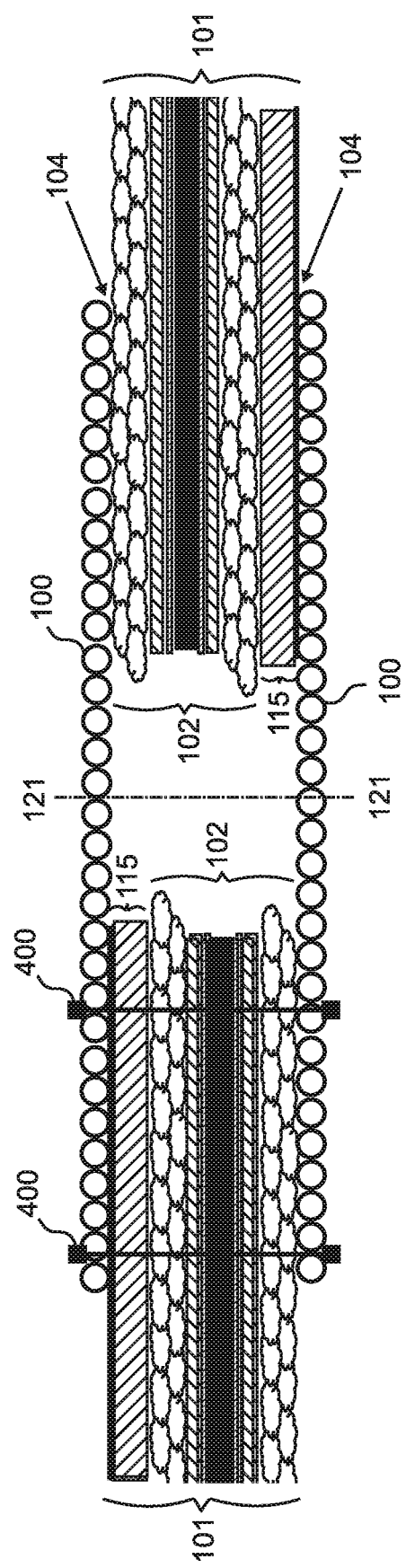

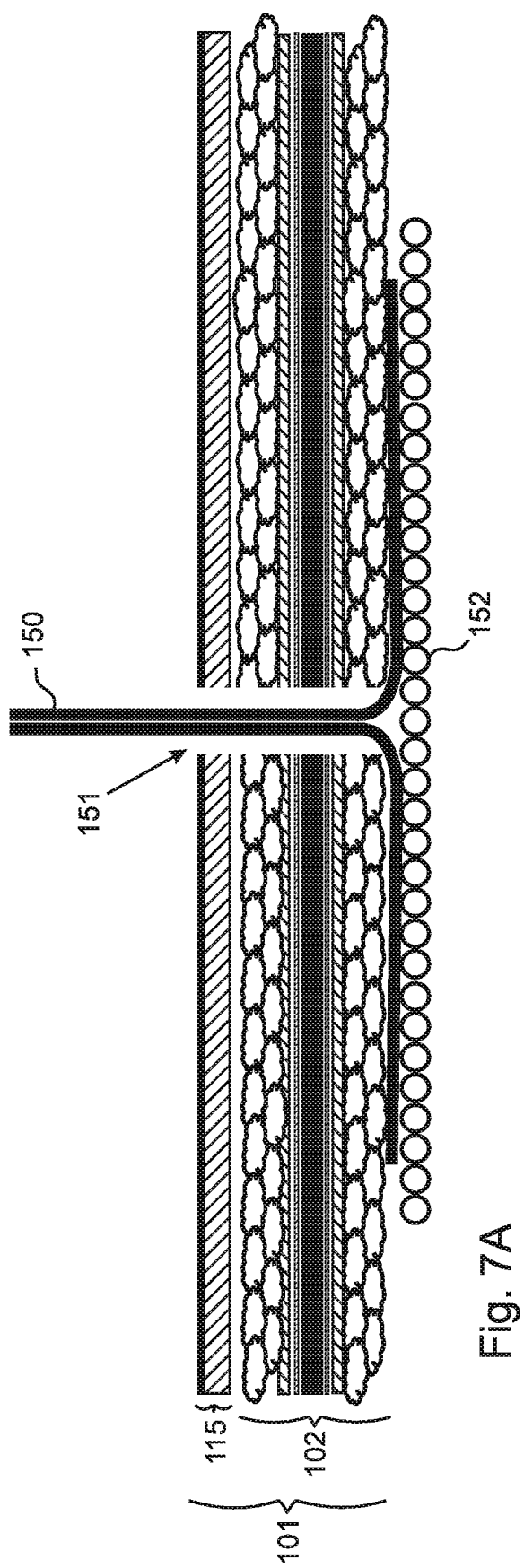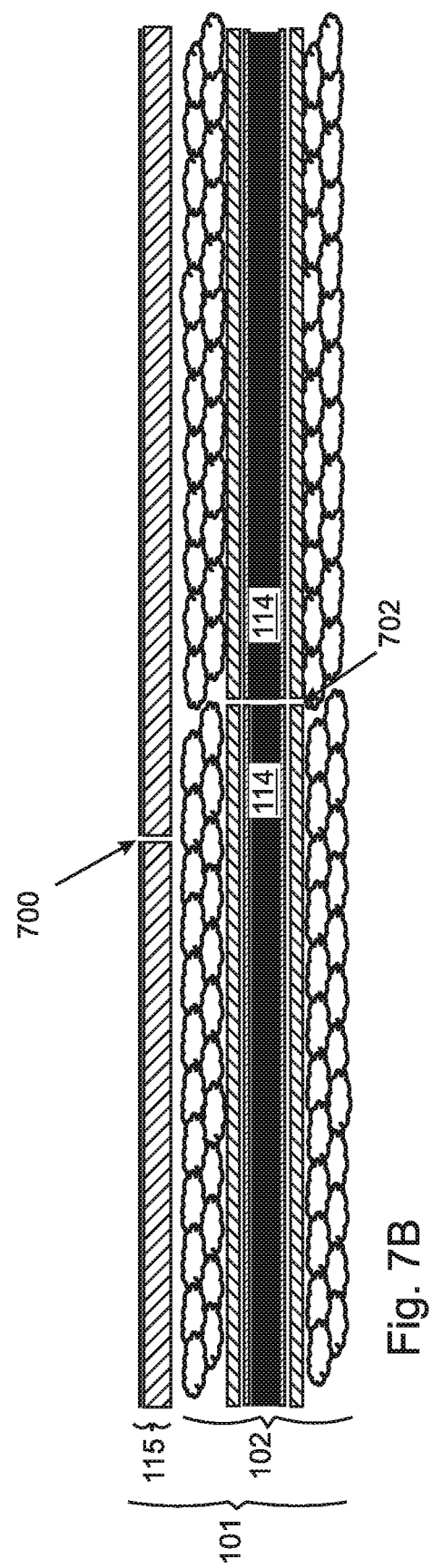

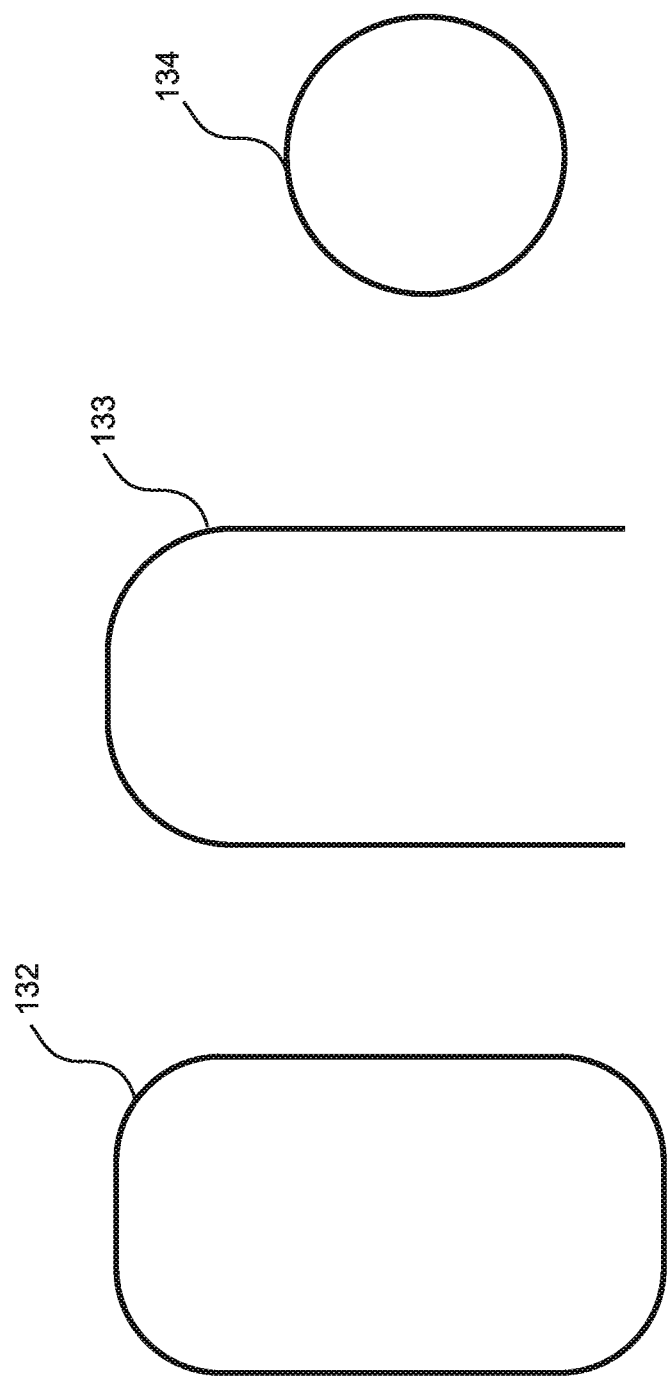

FLEXIBLE AND FOLDABLE ELECTROMAGNETIC SHIELDING

RELATED APPLICATIONS

This application claims the benefit of U.S. Provisional Application No. 62/824,444, filed on Mar. 27, 2019, which is herein incorporated by reference in its entirety for all purposes.

FIELD OF THE INVENTION

The invention relates to electromagnet shielding, and more particularly to flexible electromagnetic shielding.

BACKGROUND OF THE INVENTION

Camouflage, which can be broadly defined as apparatus and methods for protecting covert mobile and stationary objects from detection, is an important requirement for many civilian and military applications. There are at least two principle requirements that must be met by camouflage so as to avoid detection. First, a camouflage shield must mimic the energy reflective properties of a surrounding environment. To this end, camouflage that is used to shield vehicles and other mobile and stationary ground-based assets typically presents colors and marking patterns that attempt to match colors and patterns in the visible background. Advanced camouflage systems implement features that are sometimes referred to as "signature management," whereby the camouflage attempts to mimic the reflective and emissive properties of a surrounding environment in the infrared and ultraviolet spectral ranges. To this end, some camouflage systems also include humidity management features as well as "garnish" features that attempt to emulate the humidity and texture of the surrounding environment, for example the humidity and texture of leaves and other vegetation. Signature management can also include an attempt to reduce the reflectivity of the camouflage system to microwaves and other electromagnetic ("EM") energy, so as to approximate the EM reflectivity of the environment, thereby reducing the likelihood that the camouflaged asset might be detected by radar or similar means. In general, EM signature management can include features that absorb EM energy and/or features that disburse EM energy so that reflection of the EM energy to its source is reduced.

The second fundamental requirement that must be met by camouflage is to shield an underlying asset so that all forms of energy that are generated by the asset, such as sound, heat, and electromagnetic emissions, are blocked, and do not radiate into the environment. Accordingly, comprehensive camouflage systems sometimes include acoustic insulation to deaden sound, thermal shielding and/or active cooling to block heat-related infrared emissions, an opaque layer to block light and IR emissions, and an electrically conducing and/or EM absorbing layer to prevent the emission of EM radiation.

Many rigid, electrically conductive EM shielding systems are available. In particular, metal plates and panels, as well as metal sheets, metal mesh, and/or conductive paints applied to rigid panels, can all provide EM shielding for substantially rigid enclosures. However, when protecting mobile assets, it is often necessary for camouflage to be "soft packable," such that it can be collapsed or folded into a compact space for transportation, and then unpacked and deployed when a destination is reached. For this reason, camouflage covers that are formed using flexible and foldable fabric and/or polymeric sheets are often preferred.

Unfortunately, it can be difficult to provide EM shielding that is both flexible and foldable for applications that require EM shielding over a broad range of frequencies. For this reason, flexible, "soft packable" lightweight EM shielding is not generally available for civilian or military enclosures.

Table 1 presents a brief summary of the frequencies and corresponding wavelengths that are used for various modes of communication and other purposes, and that may need to be blocked by an EM shield included in a camouflage solution.

TABLE 1

EM frequencies and wavelengths used for various communication modes and other purposes.

| Name of range | Abbr. | Range | | Uses |
|---|---|---|---|---|
| Low Frequency | LF | 30-300 | kHz | Navigation, time signals, AM longwave |
|  |  | 10-1 | km | broadcasting (Europe and parts of Asia), RFID, amateur radio |
| Medium Frequency | MF | 300-3000 | kHz | AM (medium-wave) broadcasts, |
|  |  | 1000-100 | km | amateur radio, avalanche beacons |
| High Frequency | HF | 3-30 | MHz | Shortwave broadcasts, citizens band radio, |
|  |  | 100-10 | m | amateur radio and over-the-horizon aviation communications, RFID, over-the-horizon radar, automatic link establishment (ALE)/ near-vertical incidence skywave (NVIS) radio communications, marine and mobile radio telephony |
| Very high Frequency | VHF | 30-300 | MHz | FM, television broadcasts, line-of-sight |
|  |  | 10-1 | m | ground-to-aircraft and aircraft-to-aircraft communications, land mobile and maritime mobile communications, amateur radio, weather radio |
| Ultra high Frequency | UHF | 300-1000 | MHz | Television broadcasts, microwave oven, |
|  |  | 1-.1 | m | microwave devices/communications, radio astronomy, mobile phones, wireless LAN, Bluetooth, ZigBee, GPS and two-way radios such as land mobile, FRS and GMRS radios, amateur radio, satellite radio, Remote control Systems, ADSB |

TABLE 1-continued

EM frequencies and wavelengths used for various communication modes and other purposes.

| Name of range | Abbr. | Range | Uses |
| --- | --- | --- | --- |
| Super high frequency | SHF | 1-30 GHz 100-10 mm | Radio astronomy, microwave devices/communications, wireless LAN, DSRC, most modern radars, communications satellites, cable and satellite television broadcasting, DBS, amateur radio, satellite radio |

Depending on the specific application, it can be necessary to suppress EM radiation by at least 20 dB over at least the SHF range, e.g. from 1 GHz to 30 GHz. In other applications, it can be necessary to suppress EM radiation by up to 80 dB over the full range from LF to SHF, i.e. from 30 Hz to 30 GHz.

The interaction between EM radiation and a conductive barrier varies as a function of the frequency (or wavelength) of the EM energy. In particular, the ability of EM radiation to penetrate into and through a conductive material ("skin depth") is greatest at low frequencies, while the ability of EM energy to penetrate through hairline cracks, pores, and other small gaps in a conductive sheet is greatest at high frequencies.

Suppressing EM radiation by 20-80 dB over the SHF range can be challenging for a soft packable system. Suppression by at least 20 dB over the full range of frequencies from LF to SHF is difficult in all cases, and is even more difficult for a soft packable system. This is because a continuous, flexible conductive layer that is thick enough to block low frequency EM radiation is likely to suffer metal fatigue and develop cracks after repeated flexing and folding. Such cracks can widen over time and permit leakage of higher frequency EM radiation through the shielding.

For example, a conductive metallic sheet that is fabricated as rolled foil will tend to undergo metal fatigue and to work-harden when repeatedly flexed and folded, which can cause these materials to crack and to allow EM energy at higher frequencies such as SHF energy to leak through. And if the foil is made sufficiently thin to avoid metal fatigue and cracking, then it will typically be too thin to provide shielding at low frequencies, due to the greater skin depth at those frequencies. One approach would be to use a very thin foil made of pure gold or platinum for enhanced conductivity and reduced skin depth, but SUCH foils would be prohibitively expensive and would lack required structural strength.

Another approach is to use a silvered polymer sheet, such as silvered. Mylar. However, the metallic coating on such materials is typically too thin to provide adequate suppression of EM emissions at lower frequencies. Or, if the conductive layer is made sufficiently thick to shield low frequency EM emissions, then it will be subject to metal fatigue and cracking, as noted above, as well as "flaking" of the metal coating whereby small island gaps are formed through which UHF and SHE frequencies might penetrate.

Yet another requirement for some camouflage solutions is that they must be capable of multi-year outdoor exposure to environmental factors such as UV light, wind loading and wind induced flutter, rain, snow and ice, and chemical action by water, oxygen, mold, acid rain, and ozone.

What is needed, therefore, is a flexible and foldable EM shield that is able to reliably suppress EM radiation by at least 20 dB over a frequency range from 1 GHz to 30 GHz, and in embodiments over the range from 30 Hz to 30 GHz, even after being repeatedly flexed and folded, and is capable of withstanding multi-year outdoor exposure to environmental factors such as water, oxygen, UV light, wind loading and wind induced flutter, rain, snow and ice, and chemical action by mold, acid rain, and ozone.

SUMMARY OF THE INVENTION

The invention is a flexible and foldable EM shield laminate that is able to reliably suppress EM radiation by at least 20 dB over a frequency range from 1 GHz to 30 GHz, and in embodiments from 30 Hz to 30 GHz, even after being repeatedly flexed and folded. After being flexed and folded at least 10 times, the disclosed EM shield laminate will retain at least 90% of its electromagnetic suppression over the frequency range from 1 GHz to 30 GHz, and in embodiments over the full range from 30 Hz to 30 GHz, where each repetition of flexing and folding includes folding the shield into at least five stacked, abutting layers and then unfolding the shield again into a single layer. Embodiments are capable of withstanding multi-year outdoor exposure to environmental factors such as water, oxygen, UV light, wind loading and wind induced flutter, rain, snow and ice, and chemical action by mold, acid rain, and ozone.

Embodiments can be used to provide electromagnetic ("EM") shielding of civilian and military systems and assets. It should be noted that even though much of the present disclosure is directed to camouflage embodiments, the present invention is not limited to camouflage applications, but applies to any application that requires a flexible and foldable barrier to EM penetration over a wide frequency range. It should be further noted that the terms "flex-fold" and "soft-pack" are used herein to refer to a shielding structure that will retain at least 90% of its electromagnetic suppression over the frequency range from 1 GHz to 30 GHz, and in embodiments over the full range from 30 Hz to 30 GHz, after being flexed and folded at least 10 times, where each repetition of flexing and folding includes folding the shield into at least five stacked, abutting layers and then unfolding the shield again into a single layer.

The disclosed EM shield is a laminate that comprises at least one "LF" flexible conductive layer that is laminated to at least one low-stretch textile support layer. The term "LF" layer is used, because the LF layer is configured to prevent EM penetration at least at lower EM frequencies. In some embodiments, the LF layer is a continuous conductive layer that is thick enough to provide at least 20 dB suppression of EM emissions over the frequency range from 1 GHz to 30 GHz, and in embodiments from 30 Hz to 30 GHz, so that additional EM shielding is not required. For example, the LF layer can include a layer of metal foil having a thickness between 6 microns and 60 microns. The foil can be made of copper or aluminum, which are readily available metals that are not prohibitively expensive. In some of these embodiments, the LF layer can include one or more polymeric sheets onto which relatively thick metallic layers have been deposited, such as layers of aluminum deposited by chemical vapor deposition (CVD).

In various embodiments, the textile support layer enhances structural competency, absorbs tension and other stresses, and ensures that all folds will have a maximum radius, thereby reducing any tendency of the metal of the LF layer to work-harden and crack. Furthermore, if small cracks do eventually arise in the LF layer after repeated folding and packing, lamination to the textile support layer helps to maintain the edges of any such cracks in abutting alignment, such that hairline cracks are prevented from widening and forming larger gaps, and EM penetration through the cracks is thereby minimized or prevented. In embodiments, the textile support layer has an ASTM value of at least 10 lbf/inch of tensile strength with less than 30% elongation at break. Embodiments include a plurality of textile support layers. For example, a pair of textile support layers can be laminated to both the top and bottom surfaces of the LF layer.

In some embodiments at least one adhesive or coating that attaches the textile support layer to the LF layer is conductive. In some of these embodiments, the adhesive or coating includes an adhesive resin, such as urethane, thermoplastic urethane, neoprene, EPDM, Kryton, acrylic or another environmentally stable elastomer, that includes a conductive filler, such as powdered metal, metallic flakes, metal plated polymeric powders, conductive carbon blacks, graphene, and/or carbon nanotube fillers. The ratio of the filler to the elastomer can range from 5% to 45% by dry weight, depending on the filler. In some of these embodiments, the resistance of the conductive adhesive or coating is less than 1 ohm per square.

In addition to the LF layer and the textile support layer, some embodiments further include at least one high frequency EM barrier or "HF" layer. In embodiments, the LF layer and the HF layer in combination provide at least 20 dB suppression of EM emissions over the frequency range from 1 GHz to 30 GHz, and in embodiments from 30 Hz to 30 GHz. The HF layer is configured to block any EM radiation that manages to leak through the LF layer, especially at higher frequencies. In some of these embodiments, the HF layer is formed from a metallized film, where the metallization of the HF layer is between 10 and 100 nanometers thick, and thereby is substantially immune to work-hardening, cracking, and flaking. For example, the HF layer can include a layer of polymeric film that has been metallized with aluminum, silver, or copper by sputtering or by chemical vapor deposition ("CVD").

In other embodiments, the HF layer is, or includes, a layer of an elastomer, such as a cured adhesive layer, that has been filled with 5% to 25% by dry weight of conductive filler particles so as to create a conductive elastomeric layer. The conductive filler particles included in this HF elastomer layer can include carbon black, graphite powder, particles of iron oxide such as $Fe_3O_4$, and/or ferrite particles such as spherical ferrite particles. In embodiments the filler includes ferromagnetic particles that absorb electromagnet energy rather than, or in addition to, reflecting it.

In some embodiments that include an HF layer, the LF layer is not a continuous conductive layer. For example, in some of these embodiments the LF layer is a wire mesh, and in other of these embodiments the LF layer is a layer of metallization that is applied directly to a textile layer. For example, the LF layer can be a layer of aluminum, silver, or copper that is applied to the textile support layer using electroless plating.

Accordingly, in embodiments the LF and HF layers work together to reliably suppress EM emissions by at least 20 dB, and in embodiments up to 60 dB, over the SHF range i.e. from 1 GHz to 30 GHz, and in embodiments over the full range from LF to SHF, i.e. from 30 Hz to 30 GHz, even after repeatedly being folded and packed. Embodiments retain at least 90% of their electromagnetic suppression over the range of frequencies from 1 GHz to 30 GHz, and in embodiments from 30 Hz to 30 GHz, after being flexed and folded at least 10 times, where each repetition of flexing and folding includes folding the shield into at least five stacked, abutting layers and then unfolding the shield again into a single layer.

In embodiments, seams can be formed between sheets of the disclosed EM shield laminate by mechanical methods such as sewing. In embodiments, the shield laminate seams are formed separately for the LF and textile support layers. In some of these embodiments, the LF and textile support layers are separable, which facilitates the creation of the separate seams.

In various embodiments the shielding layers of adjoining sheets of the EM shield laminate are butted and seamed to each other using a metallized textile tape attached using an adhesive. Embodiments attach the metallized textile tape using an adhesive that has been filled with 5% to 45% by dry weight of conductive filler particles to form a conductive elastomer layer, so that the adhesive is able to further reflect and/or absorb EM emissions. In various embodiments, instead of or in addition to applying a metallized textile tape, the seam is covered by a layer of an elastomer that has been filled with 5% to 45% by dry weight of conductive filler particles, so that any EM emissions that may leak between the sheets of EM shield laminate and through or around the metallized textile tape (if present) are reflected or absorbed by the layer of filled elastomer.

In an exemplary camouflage embodiment, aluminum foil of 0.5 mils thickness is primed on both sides with a conductive phenolic elastomeric primer. The aluminum foil is then coated on both sides with layers of thermoplastic polyurethane (TPU) that have been filled with conductive carbon black (CCB) at 40% by weight, where each of the two layers of filled TPU has a thickness of between 1 and 2 mils. The outward-facing side of the coated aluminum foil is then laminated to a textile support layer by a primer coating and a non-conductive adhesive coating. The outer face of the textile support layer of the resulting laminate is coated with a nonconductive weathering layer having an appropriate color and IR signature according to the camouflage requirements of the implementation. The inner face of the coated foil of the laminate is laminated to a flame-resistant polyester nonwoven that is coated on each face with a layer of the conductive TPU filled with CCB.

Example A

In a similar exemplary camouflage embodiment, the EM shield laminate includes the following layers:
1. Topcoat non-conductive TPU or 2-part urethane with flame retardant and colorizing fillers
2. Tie coat non-conductive TPU with flame retardant filler
3. Primed woven textile support layer, PET, Nylon or Polypropylene
4. Tie coat non-conductive TPU with flame retardant fillers 5. Conductive metal to organic primer
6. 0.5 mil soft aluminum LF layer
7. Conductive metal to organic primer
8. Conductive TPU with CCB fillers at 40% by weight of dry film
9. PET fiber flame retardant nonwoven saturated with conductive TPU
10. Back face of laminate, conductive TPU with CCB fillers at 40% by weight of dry film It will be noted that the top face of the laminate in the exemplary embodiment supports the structural heat seal process.

A conductive seam can be formed between sections of the EM shield laminate of the exemplary example described above according to the following conductive seam tape laminate, applied to cover the back faces of the butted juncture of the sections:

1. Conductive TPU with CCB fillers (bonded to the EM shield laminate sections)
2. Conductive metal to organic primer
3. 0.5 mil soft aluminum HF layer
4. Conductive metal to organic primer
5. Conductive TPU with CCB fillers at 40% by weight of dry film
6. PET fiber flame retardant nonwoven saturated with conductive TPU
7. Conductive TPU with CCB fillers at 40% by weight of dry film (back face of the tape laminate)

Attachment of the EM shielding laminate to surrounding structures can be by lanyards and/or webbing. In embodiments, a lanyard and/or webbing penetrates the laminate sheet and is attached to a rear surface thereof, and a conductive patch is installed on the rear surface over the lanyard and/or webbing so as to block any EM emissions that might otherwise leak through the penetration(s). Instead of, or in addition to, a conductive patch, the lanyard and/or webbing can be covered by a layer of an elastomer that has been filled with 5% to 45% by dry weight of conductive filler particles.

Embodiments further prevent emission of light from a protected asset by providing an "optical blackout" feature. In particular, in some embodiments the LF layer is extremely opaque and highly effective in blocking all frequencies of visible and infrared light. And in various embodiments carbon black and/or other filler particles that are included in an HF elastomer layer cause the HF elastomer layer to be optically opaque.

Optical blackout of seams between sheets of the disclosed EM shield laminate is provided in some embodiments where the LM layer is optically opaque by providing overlap seams in the LF layers of adjoining laminate sheets. In other embodiments where the LM layer is optically opaque, the HF layer is made sufficiently thick to also provide optical blackout, and the seams between the HF layers are staggered relative to the seams between the LF layers, so that any light penetrating a seam, such as a butt seam, between adjacent LF layers is blocked by an HF layer, and vice versa. In still other embodiments optical blackout is provided by a layer of an adhesive or elastomer applied over the seam, as described above, that has been rendered optically opaque by filling with 5% to 45% by dry weight of conductive filler particles.

Some embodiments further include a thermal insulation layer for improved control of temperature differences between the protected asset and the surrounding environment, thereby reducing the thermal signature of the protected asset and improving concealment thereof. In some of these embodiments the thermal insulation layer has a thermal resistance (measured in English units) of approximately R5, thereby providing a significant reduction in heat-related infrared emissions while adding only limited mass and thickness to the camouflage cover. Embodiments can further include an actively cooled thermal barrier such as a system that circulates cooled water through a vascular system that is coordinate with the EM shield and thermal insulation.

In various embodiments, an outward-facing surface of the LF layer or HF layer is textured so as to cause impinging microwave radiation to be dispersed rather than being reflected back to its source.

In embodiments, an EM shielding system comprises a plurality of the disclosed EM shield laminates, which can be assembled together and disassembled as needed. Some of these embodiments comprise soft connectors that can be used to seal sheets of EM shield laminate to each other, and which can also provide seals around doors and access panels that can be repeatedly opened and closed. In some of these embodiments, the soft connections can be assembled quickly and without use of special tools. Various embodiments form soft connections as molded double convolute rings having shielding on one convolute combined with a matching convolute that provides a mechanical connection.

A first general aspect of the present invention is an electromagnetic barrier that includes a first textile support layer, and a first conductive layer laminated by an adhesive to the first textile support layer. The electromagnetic barrier is able to attenuate electromagnetic energy by a factor of at least 20 dB over a frequency range of 1 GHz to 30 GHz, and in embodiment over a range from 30 Hz to 30 GHz. The electromagnetic barrier is flexible and foldable, whereby the electromagnetic barrier is able to retain at least 90% of its electromagnetic suppression over the range of frequencies from 1 GHz to 30 GHz, and in embodiments over the full range from 30 Hz to 30 GHz, after being flexed and folded at least 10 times, where each repetition of flexing and folding includes folding the barrier system into at least five stacked, abutting layers and then unfolding the barrier system again into a single layer.

In embodiment, the first textile support layer has an ASTM value of at least 10 lbf/inch of tensile strength with less than 30% elongation at break.

In any of the above embodiments, the first textile support layer can comprise at least one of Nylon fibers, PET fibers, Rayon fibers, acrylic fibers, para aramid fibers, and meta aramid fibers.

In any of the above embodiments, the first textile support layer can comprise yarns of between 100 and 1500 denier.

In any of the above embodiments, the first textile support layer can include polypropylene slit tape yarn.

In any of the above embodiments, the first conductive layer can be a metallic layer deposited onto a polymer film substrate, or a metal foil layer. In embodiments, the foil layer has a thickness between 6 microns and 60 microns, and in some of these embodiments the foil layer has a thickness between 25 microns and 40 microns.

In any of the above embodiments, the electromagnetic barrier can comprise a second textile support layer laminated to a second side of the first conductive layer.

In any of the above embodiments, the first conductive layer can comprise at least one of aluminum and copper.

In any of the above embodiments, the first conductive layer can be substantially opaque to all visible and infrared radiation.

Any of the above embodiments can further include a second conductive layer.

In some of these embodiments the second conductive layer is a layer of conductive particles encapsulated as filler within an elastomeric layer. And in some of these embodiments the conductive particles include at least one of iron oxide particles graphite particles, ferrite particles, and conductive carbon black particles. The conductive particles can be present in the elastomeric layer at a loading of between 5% and 45% of dry film.

In embodiments that include a second conductive layer, the first conductive layer is a metallic mesh layer, or a first layer of metallization deposited onto a textile layer, where the textile layer can be the first support textile layer. The first layer of metallization can be deposited onto the textile layer by electroless plating.

In embodiments that include a second conductive layer, the first conductive layer can include conductive fibers that are woven in at least one direction into a textile layer. In some of these embodiments, the conductive threads have an elongation that is at least 30% of an elongation of the textile layer. And in any of these embodiments, the textile layer can be the first support textile layer.

In embodiments that include a second conductive layer, the second conductive layer can be substantially opaque to all visible and infrared radiation.

In any of the above embodiments that include a second conductive layer, the second conductive layer ca be a second layer of metallization applied to a polymer film. The second layer of metallization can be applied to the polymer film by chemical vapor deposition or by sputtering. In any of these embodiments, a thickness of the second metallization layer can be between 10 nanometers and 100 nanometers.

In any of the above embodiments that include a second conductive layer, except those embodiments where the second conductive layer is directly applied to or interwoven with the first textile support layer, the second conductive layer can be separable from the first conductive layer.

Any of the above embodiments can further include a moisture resistant phenolic primer layer between the first conductive layer and the support textile layer. In some of these embodiments, the primer layer is a moisture resistant phenolic primer layer. In any of these embodiments, the primer layer can contain a phenolic resin.

Any of the above embodiments can further include a topcoat layer applied to at least one outer face of the electromagnetic barrier, the topcoat layer being configured to protect the electromagnetic barrier from degradation from exposure to UV radiation. In some of these embodiments the topcoat layer comprises at least one of plasticized PVC, neoprene, and urethane resin. In any of these embodiments the topcoat layer can be configured to limit color changes of the electromagnetic barrier to less than 5 delta E after 10 days of exposure to xenon light as determined according to ASTM or Mil Std 810.

Any of the above embodiments can further include a coating applied to the electromagnetic barrier, the coating being configured to provide at least one of flame resistance, environmental protection, and heat sealing.

In any of the above embodiments, the electromagnetic barrier includes at least one of a lanyard and webbing attached to a rear surface thereof and configured for attaching the electromagnetic barrier to a surrounding structure. In some of these embodiments the lanyard and/or webbing extends through a penetration in the metal foil layer, said penetration being covered by a conductive patch installed on a rear surface of the electromagnetic barrier.

Any of the above embodiments can further include a thermal insulation layer. In some of these embodiments, the thermal insulation layer has a thermal resistance measured in English units of at least R5.

Any of the above embodiments can further include an actively cooled thermal barrier. In some of these embodiments, the actively cooled thermal barrier comprises a vascular system through which cooling water can be circulated.

A second general aspect of the present invention is an electromagnetic barrier system comprising a pair of barrier sections, each of the barrier sections being an electromagnetic barrier according to any embodiment of the first general aspect, the pair of barrier sections being joined by a seam.

In embodiments, the seam is formed by sewing.

In any of the above embodiments, the seam can be formed separately for the first textile support layers of the barrier sections and the first conductive layers of the barrier sections.

In any of the above embodiments, at least one of the seams can be an overlapping seam.

In any of the above embodiments, at least one of the seams can be a butted seam that is covered by at least one of a metallized textile tape that is attached over the seam by an adhesive, and a layer of conductive particles encapsulated as filler within an elastomeric layer that extends over the seam.

In any of the above embodiments, the pair of barrier sections can be configured for joining to each other by soft connections formed by molded double convolute rings having shielding on one convolute combined with a matching convolute that provides a mechanical connection.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 1A is a cross sectional illustration of an embodiment of the invention having a foil LF layer with one textile support layer;

FIG. 1B is a cross sectional illustration of an embodiment of the invention having one textile support layer, in which the LF layer includes a layer of metal deposited onto a film substrate;

FIG. 2A is an illustration similar to FIG. 1A, but for an embodiment that includes two textile support layers;

FIG. 2B is a cross-sectional illustration similar to FIG. 2A, but including a hairline crack in the foil LF layer;

FIG. 3A is a cross-sectional illustration similar to FIG. 2B, but further comprising an HF layer of metallized film;

FIG. 3B is a cross-sectional illustration similar to FIG. 2B, but further comprising an HF layer of conductive particles encapsulated within an elastomer layer;

FIG. 3C is a cross-sectional illustration similar to FIG. 3A, but wherein the LF layer comprises two metallization layers applied by electroless plating to a textile layer;

FIG. 3D is a cross-sectional illustration similar to FIG. 3B, but wherein the LF layer is two layers of metallized polymer films;

FIG. 4A is a cross sectional illustration of an overlapping seam formed between two EM barriers similar to FIG. 2A;

FIG. 4B is a cross sectional illustration similar to FIG. 4A, but where the LF and HF layers of the EM barriers are separately attached to each other;

FIG. 5 is a cross sectional illustration of an attachment of the EM shielding laminate of FIG. 2A to a nearby structure, with a flex joint therebetween;

FIG. 6 is a cross sectional illustration of an attachment of two EM shielding laminates similar to FIG. 2A having a flex joint therebetween;

FIG. 7A is a cross sectional illustration showing attachment of a foil laminate similar to FIG. 2A to a structure by a system hanger;

FIG. 7B is a cross sectional illustration showing butt-end attachment of two barrier systems similar to FIG. 2A, but with staggered junctures between the LF and HF layers;

FIG. 9C is a simplified illustration of shape profiles of a door with and without threshold and of an access panel.

DETAILED DESCRIPTION

Figure 3E:
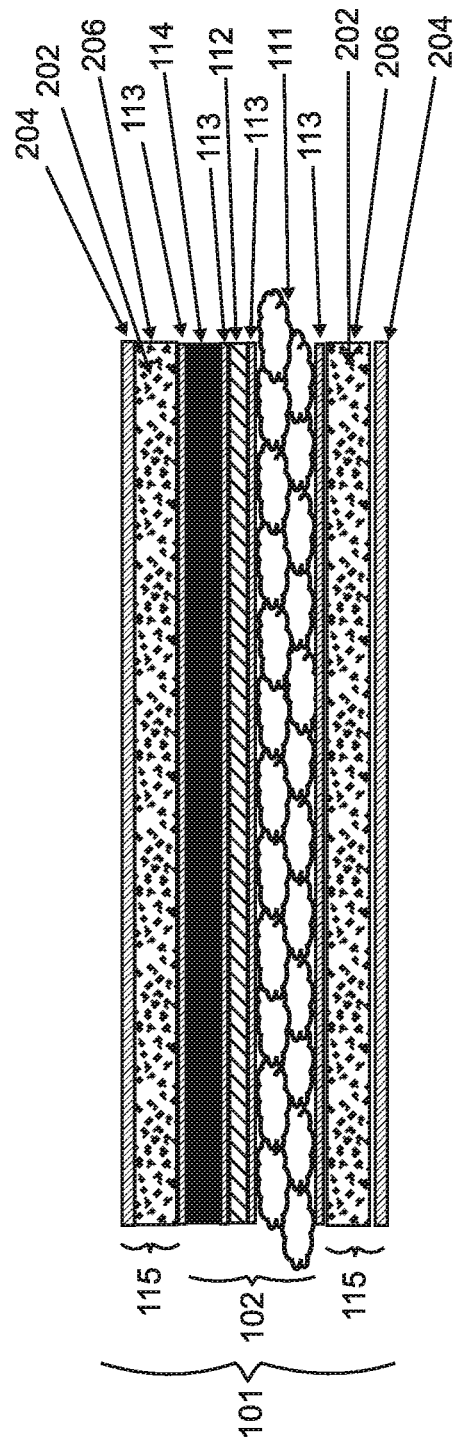
FIG. 3E is a cross-sectional illustration similar to FIG. 3B, but wherein the LF layer is a layer of aluminum foil, and wherein the EM shield laminate comprises two layers of conductive particles encapsulated within elastomer layers.

The present invention is a flexible and foldable EM shield laminate that is able to reliably block EM radiation by at least 20 dB over a frequency range from 1 GHz to 30 GHz, and in embodiments over the full range from 30 Hz to 30 GHz, even after being repeatedly flexed and folded. The disclosed EM shield laminate is able to retain at least 90% of its electromagnetic suppression over the full range of frequencies from 1 GHz to 30 GHz, and in embodiments over the full range from 30 Hz to 30 GHz, after being flexed and folded at least 10 times, where each repetition of flexing and folding includes folding the shield into at least five stacked, abutting layers and then unfolding the shield again into a single layer.

Embodiments of the present invention can be used to provide electromagnetic ("EM") shielding of civilian and military systems and assets. It should be noted, however, that even though much of the present disclosure is directed to camouflage embodiments, the present invention is not limited to camouflage applications, but applies to any application where a flexible and foldable barrier is required that will shield against EM penetration over a wide frequency range. It should be further noted that the terms "flex-fold" and "soft-pack" are used herein to refer to a shielding structure that will retain at least 90% of its electromagnetic suppression over a range of frequencies from 1 GHz to 30 GHz, and in embodiments over the full range from 30 Hz to 30 GHz, after being flexed and folded at least 10 times, where each repetition of flexing and folding includes folding the shield into at least five stacked, abutting layers and then unfolding the shield again into a single layer, for example when being packed into a container for transport and then unpacked for deployment.

With reference to FIG. 1A, the disclosed EM flex-fold shield includes an LF laminate 102 that comprises at least one flexible conductive layer 114, referred to as the LF layer 114, which is laminated by an adhesive 112 such as a thermoplastic to at least one low-stretch textile support layer 111. In the embodiment of FIG. 1A, the LF layer 114 is a continuous layer of metal foil having a thickness between 6 microns and 60 microns that provides at least 20 dB suppression of EM emissions over a range of frequencies from 1 GHz to 30 GHz, and in embodiments over the full range from 30 Hz to 30 GHz. The foil 114 can be made of copper or aluminum, which are readily available metals that are not prohibitively expensive. The LF layer 114 can be treated with a primer 113, which may contain a phenolic. With reference to FIG. 1B, in similar embodiments the LF laminate 102 includes one or more polymeric sheets 200 onto which relatively thick metallic LF layers 114 have been deposited, such as layers of aluminum deposited by chemical vapor deposition (CVD).

In embodiments, the textile support layer 111 can comprise a single and/or multifilament yarn that includes fibers of Nylon, PET, Rayon, Acrylic, and/or para or meta Aramid of between 100-1500 denier, and/or polypropylene slit tape yarn. The textile support layer can have an ASTM value of at least 10 lbf/inch of tensile strength with less than 30% elongation at break. In various embodiments, the support layer 111 enhances structural competency, absorbs tension and other stresses, and ensures that all folds will have a minimum radius, thereby reducing any tendency of the LF layer 114 to work-harden and crack.

With reference to FIG. 2A, embodiments of the disclosed LF laminate 102 include textile support layers 111 that are laminated to both the top and bottom surfaces of the LF layer 114. With reference to FIG. 2B, if small cracks 120 do eventually arise in the metal of the LF layer 114 after repeated folding and packing of the EM shield laminate 102, the textile support layer(s) 111 help to maintain the edges of any such cracks 120 in abutting alignment due to lamination of the LF layer 114 to the support layer(s) 111, such that any hairline cracks 120 are prevented from widening and forming larger gaps, and such that penetration of EM energy through the cracks 120 is reduced or prevented.

The textile support layer(s) 111 provide sufficient tensile strength, stiffness and flex strength to reduce or prevent work hardening and cracking of the metal of the LF layer 114 during prolonged use. In embodiments, the textile support layer 111 has an ASTM value of at least 10 lbf/inch of tensile strength, with less than 30% elongation at break. Because low elongation is preferred, nonwovens and wovens are generally superior to knits as textile support layers 111. Fiber types used in the textile support layer(s) 111 in various embodiments include polyethylene terephthalate (PET), nylon, acrylic, polypropylene, meta and para aramid, viscose and/or flame-resistant viscose, cotton, and lyocell. In embodiments where flame resistance is required, para or meta aramid, fiberglass, and/or flame-resistance treated cellulosic fibers can be used in the textile support layer(s) 111. Embodiments include webs of 30-300 gr/m2.

Non-wovens based on spun bonding, resin bonding, and/or needling are used in various embodiments.

In embodiments, the LF layer 114 includes copper and/or aluminum, due to favorable cost and availability. For these materials a metal thickness of 12 microns can provide a suppression of at least 20 dB over a range of frequencies from 1 GHz to 30 GHz, and in embodiments over the full range from 30 Hz to 30 GHz. Somewhat better shielding can be achieved using a metal layer having a thickness of between 25 and 40 microns. However, thinner layers are used in other embodiments to reduce system mass and pack volume and enhance flex fold durability. In embodiments where the LF layer 114 is a layer of metal foil, the foil can be made from a rolled and annealed metal used in its dead soft condition.

The bonding quality of the LF layer 114 to the support textile 111 by the adhesive layer 112 is a critical factor in the flexing and folding tolerance, and in the overall durability of the LM laminate 102. So as to improve bonding of the LF layer 114 to the adhesive layer 112, in embodiments the LF layer 114 is primed 113, for example using a chromate conversion coating, solvent base phenolic primer and/or another primer system. In some embodiments, a conductive primer is used, such as a primer that has been filled with conductive particles. The primer system 113 provides a modulus transition from the metal of the LF layer 114 to the lower modulus adhesive layer 112. Adhesives 112 such as two-part thermoplastic urethanes and reactive hot-melt urethanes, styrene butadiene rubber-based adhesives, and acrylic based adhesive are effective for adhering the support textile 111 to the primed metal of the LF layer 114. In some embodiments, thermoplastic or reactive thermoplastic adhesives are used. Thermoplastic adhesives can be advantageous because they can simplify the lamination of the system layers after preparation of the components.

The textile support layer 111 must also be well bonded to the adhesive layer 112. In embodiments, preparation of the textile support layer 111 for bonding includes a scouring process that leaves a minimum residue of yarn spin finish and other fiber processing lubricants on the fiber surface. Adhesives used in bonding of non-wovens are acceptable, so long as they are compatible with the lamination adhesive 112 that is selected. Isocyanate and epoxy-based primers are suitable for most of the fiber material options. In some cases, corona or plasma treatments are required in addition to primers. PET, nylon, acrylic, polypropylene, meta and para aramid, viscose and fire-resistant viscose, cotton, lyocell and other fibers are all suitable fibers, and can be primed with isocyanate and/or epoxy-based materials.

Overall, the laminate adhesive layer 112 provides control of the LF layer 114 and limits the formation of gaps in the metal of the LF layer 114 due to flexing, folding, and other causes that might occur to the EM shield laminate. Any damage to the metal of the LF layer 114 can compromise the shielding effectiveness. For this reason, the quality of the lamination bonds formed by the laminate adhesive layer 112 is important to the success of the invention. In embodiments, the ASTM D1876T peel/inch of the textile support layer 111 to the LF layer 114 is greater than 2 lbs/in, and in some embodiments it is greater than 5 lbf/in. Note that these values are based the average peel strength, and not on the average of 5 highest peak values.

In some embodiments at least one adhesive layer 112 or coating that attaches the textile support layer 111 to the LF layer 114 is conductive, thereby further reducing the impact of any hairline cracks or other defects that might occur in the LF layer 114 by ensuring that the cracks or defects are covered by a conductive layer. In some of these embodiments, the adhesive layer 112 or coating comprises an adhesive resin, such as urethane, thermoplastic urethane, neoprene, EPDM, Kryton, acrylic or another environmentally stable elastomer, that includes a conductive filler, such as powdered metal, metallic flakes, metal plated polymeric powders, conductive carbon blacks, graphene, and/or carbon nanotube fillers. The ratio of the filler to the elastomer can range from 5% to 45% by dry weight, depending on the filler. In some of these embodiments, the resistance of the conductive adhesive or coating is less than 1 ohm per square.

Durability of the bond formed by the laminate adhesive layer 112 can be evaluated using methods included in Mil-Std 810. Accelerated aging of the laminate adhesive layer 112 can be based on conditioning of T peel samples under near steam conditions for up to 11 days. In embodiments that must be suitable for environmental exposure, the peel strength of the bond formed by the laminate adhesive layer 112 after steam conditioning is an important consideration. Embodiments maintain at least 2 lbf/inch T peel results after conditioning.

With reference to FIG. 3A, in addition to the LF laminate 102, which includes at least one LF layer 114 and at least one textile support layer 111, in some embodiments the EM shield laminate 101 further include at least one high frequency EM barrier 115, referred to herein as an "HF" barrier 115, that is able to block any EM radiation that penetrates the LF layer 114, especially at higher frequencies. The HF barrier 115 can be attached to the full surface of the LF laminate 102, attached to the LF laminate 102 only at the seams, or fully separable from the LF laminate 102.

In the embodiment of FIG. 3A, the HF barrier 115 includes a film 110, to which a layer of metallization 105 has been applied. In embodiments, the metallization layer 105 is between 10 and 200 nanometers thick, and is thereby substantially immune to work-hardening, cracking, and flaking. In embodiments, the HF barrier 115 includes a layer of polymeric film 110 to which the metallization 105 can be applied by sputtering or by chemical vapor deposition ("CVD"). In embodiments the metallization layer 105 can include any of the conventional CVD metals, including any combination of copper, aluminum, silver, nickel, tin, and/or noble metals. The thicknesses of the metallization layer 105 included in the HF barrier 115 in some embodiments will depend on the shielding performance that is required by the specific application of the embodiment, and on the EM shielding characteristics of the LF layer 114 in that embodiment.

In various embodiments where the HF barrier 115 includes an organic support film 110 to which a layer of metallized metal 105 is applied, the organic support film 110 can be any practical film material. The tensile strength, tear toughness, and metallic adhesion are all important selection criteria for the support film 110. Embodiments include polyethylene terephthalate (PET), nylon polyimide, and other bi-axially oriented films as support films 110. In cases where flame resistance is required, a flame retardant coating can be applied to either or both sides of the support film 110. Embodiments can include a coating applied over the metallic layer(s) 105 to protect the metallic layer(s) 105 from degradation due to environmental exposure. For example, a coating of thermoplastic urethane with a flame retarding filler can be applied to cover the metallic layer 105 so as to provide good flame resistance, good environmental durability and heat sealability for assembly of larger structures.

Biaxial film thicknesses range from 6 to 50 microns. Fire-resistant thermoplastic urethane coatings can range in thickness from 6-50 micron.

With reference to FIG. 3B, in other embodiments the HF barrier 115 includes an elastomer layer 206 such as a cured adhesive layer that has been filled with 5% to 25% by dry weight of conductive filler particles 202 so as to create a conductive elastomeric layer. The conductive filler particles 202 can include carbon black, graphite powder, particles of iron oxide such as $Fe_3O_4$, and/or ferrite particles such as spherical ferrite particles. Embodiments include ferromagnetic particles 202 that absorb electromagnet energy rather than or in addition to reflecting it. The embodiment of FIG. 3B further includes a crosslinked polyether urethane topcoat 204 that protects the elastomer layer 206 from exposure to ultraviolet radiation.

In some embodiments that include an HF barrier 115, the LF layer 114 is not a continuous conductive layer. For example, the LF layer 114 can be a layer of wire mesh. In the embodiment of FIG. 3C the LF layer 114 comprises two layers of metallization that are applied to a textile layer. The metallization can be layers of silver and/or copper, applied to the textile layer using electroless silver plating. In similar embodiments the LF layer(s) of metallization 114 are applied directly to one or more of the textile support layers 111.

Accordingly, in embodiments the LF layer 114 and HF barrier 115 of the EM shield laminate 101 work together to reliably suppress EM emissions by at least 20 dB, and in embodiments up to 60 dB, over the SHF frequency range, i.e. from 1 GHz to 30 GHz, and in embodiments over the full range from LF to SHF, i.e. from 30 Hz to 30 GHz, even after repeatedly being folded and packed.

Some additional exemplary embodiments of the disclosed EM shield laminate include the following layers:

Example B, FIG. 3D

Crosslinked polyether urethane topcoat 204
Polyester urethane absorbing tie coat adhesive layer 206 filled with 5-25% by dry weight of Ferrite and carbon black 202
Moisture resistant phenolic primer 113
CVD deposited aluminum 114
PET film 110
Moisture resistant phenolic primer 113
Polyester urethane adhesive tie coat layer 112
Isocyanate primer 113
Support Textile 111
Isocyanate primer 113
Polyester urethane adhesive tie coat layer 112
Moisture resistant phenolic primer 113
CVD deposited aluminum 114
PET film 110
Moisture resistant phenolic primer 113
Crosslinked polyether urethane topcoat 204

Note that Example B includes two LF layers, each of which includes a CVD deposited LF aluminum layer 114 applied to an underlying PET film layer 110. Note further that all of Examples B-E include "topcoat" layers 204 on both outward facing sides of the EM shield laminate. The topcoat layers 204 can comprise plasticized PVC, neoprene or urethane resin, and can include a pigment and/or other UV protective materials that are sufficient to limit color changes of the topcoat layers 204 to less than 5 delta E after 10 days of exposure to xenon light, according to ASTM or Mil Std 810.

Example C, FIG. 3E

Crosslinked polyether urethane topcoat 204
Polyester urethane absorbing tie coat adhesive layer 206 filled with 5% to 25% by dry weight of Ferrite and carbon black 202
Moisture resistant phenolic primer 113
0.0005" aluminum foil 114
Moisture resistant phenolic primer 113
Polyester urethane adhesive tie coat layer 112
Isocyanate primer 113
Support Textile 111
Isocyanate primer 113
Polyester urethane absorbing tie coat adhesive layer 206 filled with conductive carbon black loading at 5% to 25% of dry film 202
Crosslinked polyether urethane topcoat 204

Note that Example C includes two HF barriers 115 formed as polyester urethane tie coat adhesives 206 that are filled with conductive and ferrous particles 202. The particles 202 can be in a resin binder, and can include carbon black, conductive carbon black, graphite powder, $Fe_3O_4$ and other iron oxides, and/or ferrite particles including spherical materials. The HF barrier layers 115 are considered to be energy "absorbing" because the particles 202 absorb a significant fraction of impingent EM energy, in addition to reflecting EM radiation. Note also that the carbon black particles 202 in these HF barrier layers 115 further increase the opaqueness of the EM shield laminate 101.

Figure 3F:
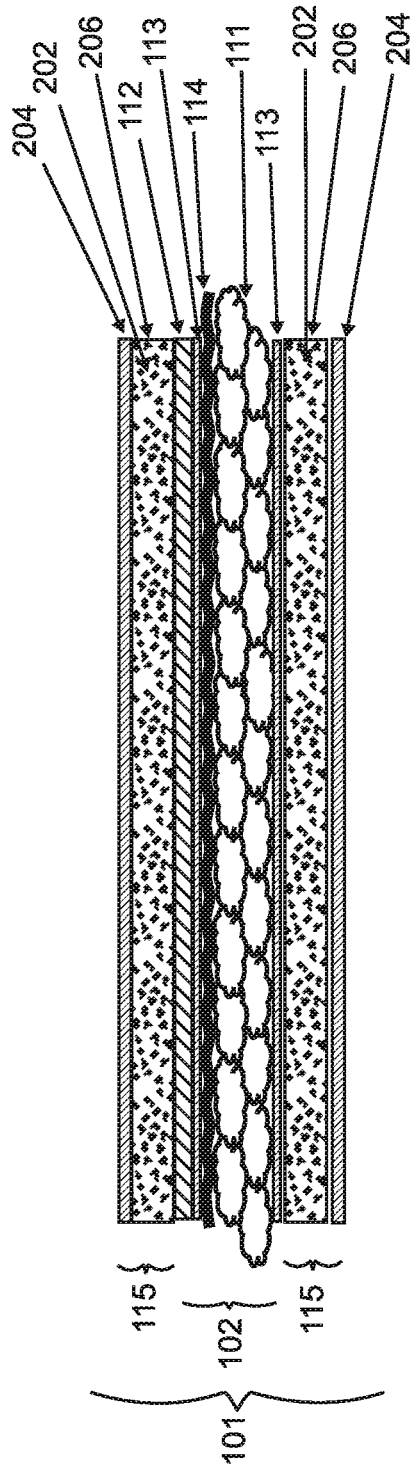
FIG. 3F is a cross-sectional illustration similar to FIG. 3E, but wherein the LF layer is a layer of metallization applied to the support textile layer.

Example D, FIG. 3F

Crosslinked polyether urethane topcoat 204
Polyester urethane absorbing tie coat adhesive layer 206 filled with 5% to 25% by dry weight of Ferrite and carbon black 202
Polyester urethane adhesive tie coat layer 112
Moisture resistant phenolic primer 113
support textile 1 oz/yd 111 with silver plated layer 114
Moisture resistant phenolic primer 113
Polyester urethane absorbing tie coat adhesive layer 206 filled with conductive carbon black loading at 5% to 25% of dry film 202
Crosslinked polyether urethane topcoat 204

Figure 3G:
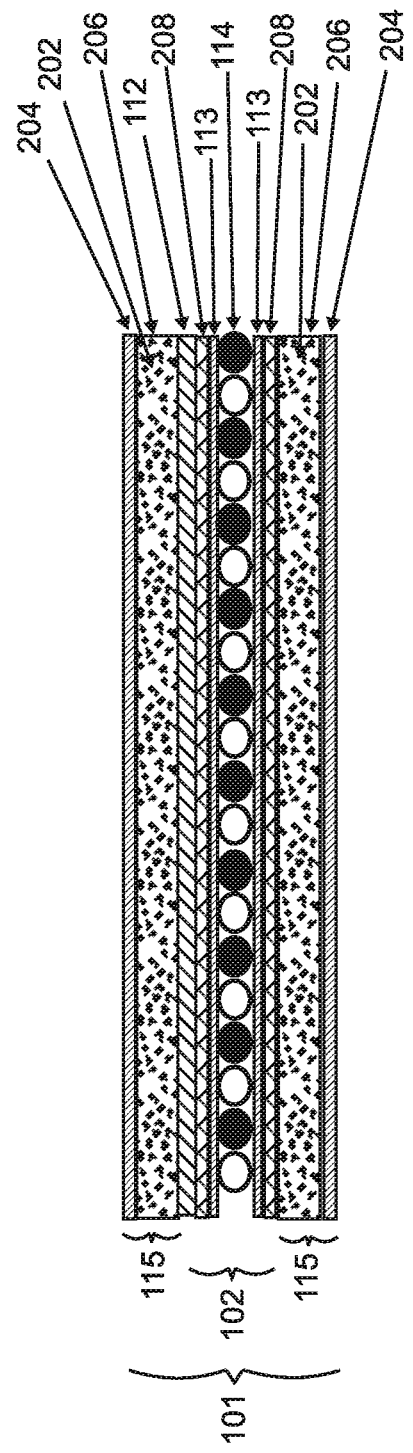
FIG. 3G is a cross-sectional illustration similar to FIG. 3F, but wherein the LF layer is a layer of conductive fibers that are woven into the support textile layer.

Example E, FIG. 3G

Crosslinked polyether urethane topcoat 204
Polyester urethane absorbing tie coat adhesive layer 206 filled with 5% to 25% by dry weight of Ferrite and carbon black 202
Polyester urethane adhesive tie coat layer 112
adhesive primer 208
Moisture resistant phenolic primer 113
PET filament woven textile 115 with 0.006" copper wire second beam 114
Moisture resistant phenolic primer 113
adhesive primer 208
Polyester urethane adhesive tie coat layer 206 filled with conductive carbon black loading at 5% to 25% of dry film 202
Crosslinked polyether urethane topcoat 204

Note that in Example E the LF layer 114 is a copper wire that is woven into the support textile 111. Embodiments include LF layers 114 incorporated into the support textile layer(s) 111 and/or into other textile layers, where the LF layers 114 include conductive fibers included in either or both of the weave directions of the textile. In embodiments, these conductive fibers have elongations of at least 30% of the elongation of the textiles into which they are woven.

The requirements discussed above with reference to avoiding damage to the foil or wire of the LF layer 114 also apply to any seams between sections of the disclosed EM shield laminate 101, i.e. gaps in the shielding must be avoided. This can be accomplished either with adequate overlap seams or with butt seams that are covered by overlapping layers that provide EM shielding, such as conductive tapes and/or layers of adhesive or thermoplastic that have been filled with conductive particles. Sections of the EM shield laminate 101 can be sewn and or adhesively bonded to each other. Adhesives such as solvent cements, and heat seal adhesives are suitable to various embodiments.

With reference to FIG. 4A, in embodiments seams 400 can be formed between sections of the EM shield laminate 101 by mechanical methods such as sewing, and/or by an adhesive 104. In the embodiment of FIG. 4B, the seams 400 between sections of LF laminate 102 are formed separately for the LF layers 114 and textile support layers 111. In the illustrated embodiment, the LF layers 114 and textile support layers 111 are separable, which facilitates the creation of the separate seams 400.

Figure 4C:
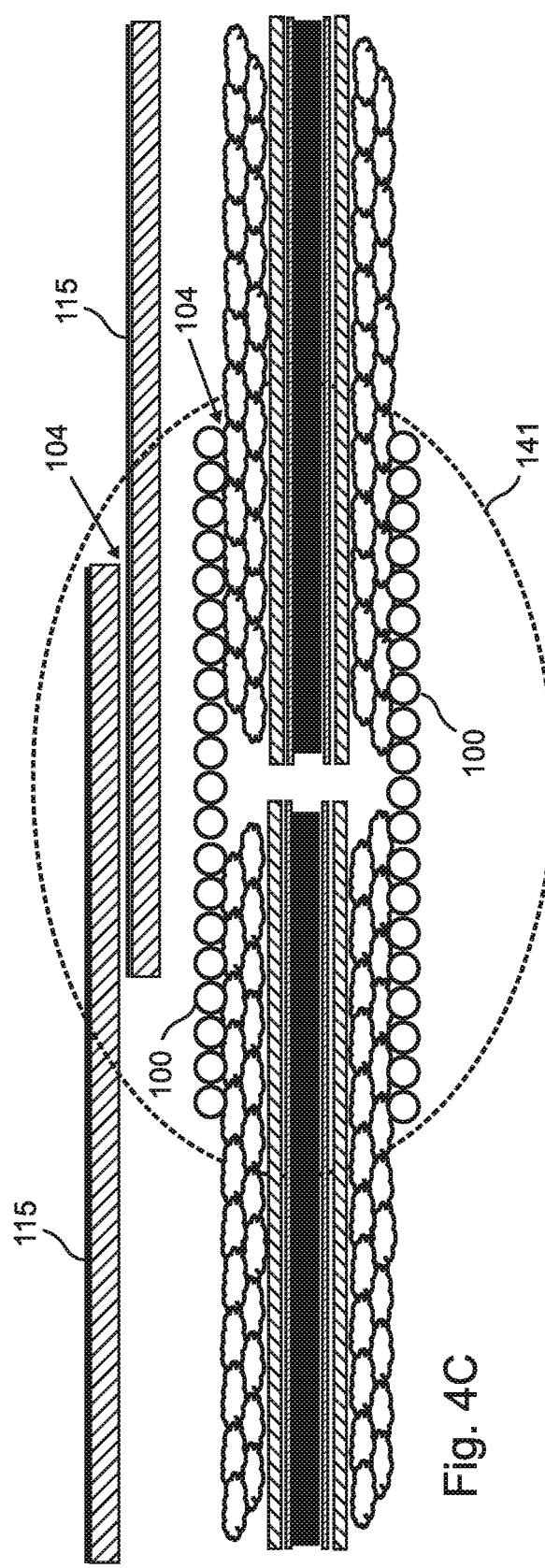
FIG. 4C is a cross sectional illustration of a seam formed between two EM barriers similar to FIG. 2A, where the LF layers are butt-seamed and the HF layers are overlapped.

With reference to FIG. 4C, in various embodiments adjoining LF laminate sections 102 are butted and joined 141 to each other using a metallized textile tape 100 that is attached using an adhesive 104. Note that in the embodiment of FIG. 4C the "tape" 100 is made of the same material as the metallized textile that is used as the LF layer 114 in FIG. 3C. In embodiments, a layer of an elastomer is applied across the gap between the adjoining LF laminate sections 102, such as a cured adhesive layer, that has been filled with 5% to 45% by dry weight of conductive filler particles so as to create a conductive elastomeric layer. The elastomeric layer can be applied instead of the metallized textile tape 100 of FIG. 4C, or it can be applied in addition to the metallized textile tape 100, for example applied over the tape 100.

With reference to FIG. 5, the EM shield laminate 101 can be attached to surrounding structures 103 by any of various means. In the figure, connecting sheets 500 of metallized textile are sewn 400 to the EM shield laminate 101 and attached by an adhesive 104 to a structure 103, thereby providing a flex transition or hinge line 121. In FIG. 6 the same approach is used to attach two sections 101 of the EM shield laminate 110 to each other.

With reference to FIG. 7A, the EM shield laminate 101 can be attached to structures by system hangers such as lanyards and/or webbing 150. In embodiments, a lanyard and/or webbing 150 penetrates the EM shield laminate sheet 101 and is attached to a rear surface thereof, and a conductive patch 152 is installed on the rear surface over the lanyard and/or webbing 150 so as to block any EM emissions that might otherwise leak through the penetration(s) 151. In embodiments, a layer of an elastomer is applied across the penetration(s) 151, such as a cured adhesive layer, that has been filled with 5% to 45% by dry weight of conductive filler particles so as to create a conductive elastomeric layer. The elastomeric layer can be applied instead of the conductive patch 152 of FIG. 7A, or it can be applied in addition to the conductive patch 152, for example applied over the conductive patch 152.

Embodiments further prevent emission of light from a protected asset by providing an "optical blackout." In particular, the LF layer 114 in embodiments of the disclosed EM shield laminate 101 is extremely opaque and highly effective in blocking all frequencies of visible and infrared light. In other embodiments, conductive fillers 202 such as carbon black render elastomeric HF layers 115 highly opaque.

For some shielding systems that include a plurality of sections of EM shield laminate 101, and for which the LF layer 102 is opaque, optical blackout is provided at the junctures between the sections of EM shield laminates 101 by overlapping the LF layers 102 of adjoining sections of the EM shield laminates 101, such as in FIGS. 4A and 4B. With reference to FIG. 7B, in other embodiments where both the LF layer and the HF layer 115 are opaque, the junctures 700 between the HF layers 115 of adjoining sections of EM shield laminate 101 are staggered relative to the junctures 702 between the LF layers 102, so that any light penetrating a juncture 702, such as a butt seam, between the conductive layers 114 of adjacent opaque LF layers 102 is blocked by the overlapping, opaque HF layer 115, and vice versa.

Figure 8:
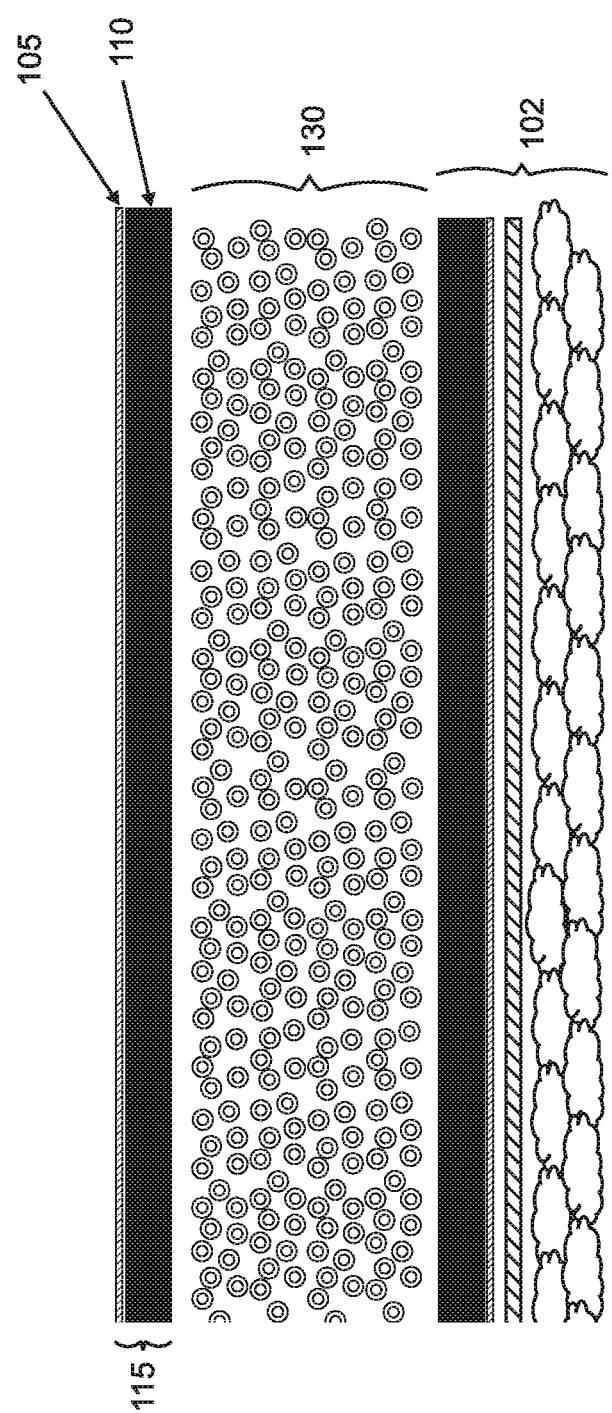
FIG. 8 is a cross sectional illustration of an embodiment of the present invention that includes a layer of thermal insulation.

With reference to FIG. 8, some embodiments further include a thermal insulation layer 130 for improved control of temperature differences between the protected asset and the surrounding environment, thereby reducing the thermal signature of the protected asset and improving concealment thereof. In some of these embodiments, the thermal insulation layer 130 has a thermal resistance (measured in English units) of approximately R5, thereby providing a significant reduction in thermal emissions from the protected asset while adding only limited mass and thickness to the camouflage cover. The thermal insulation layer 130 need not be laminated or bonded to the full surface of the EM shield laminate 101. Instead, the thermal insulation layer 130 can be attached only at the seams, and/or the thermal insulation 130 and EM shield laminate 101 layers can be separable. In the embodiment of FIG. 8, the layer of thermal insulation 130 is sandwiched between the HF layer 115 and the LF layer 102.

Embodiments can further include an actively cooled thermal barrier (not shown) such as a system that circulates cooled water through a vascular system that is coordinate with the EM shield laminate 102 and thermal insulation 130.

Figure 9A:
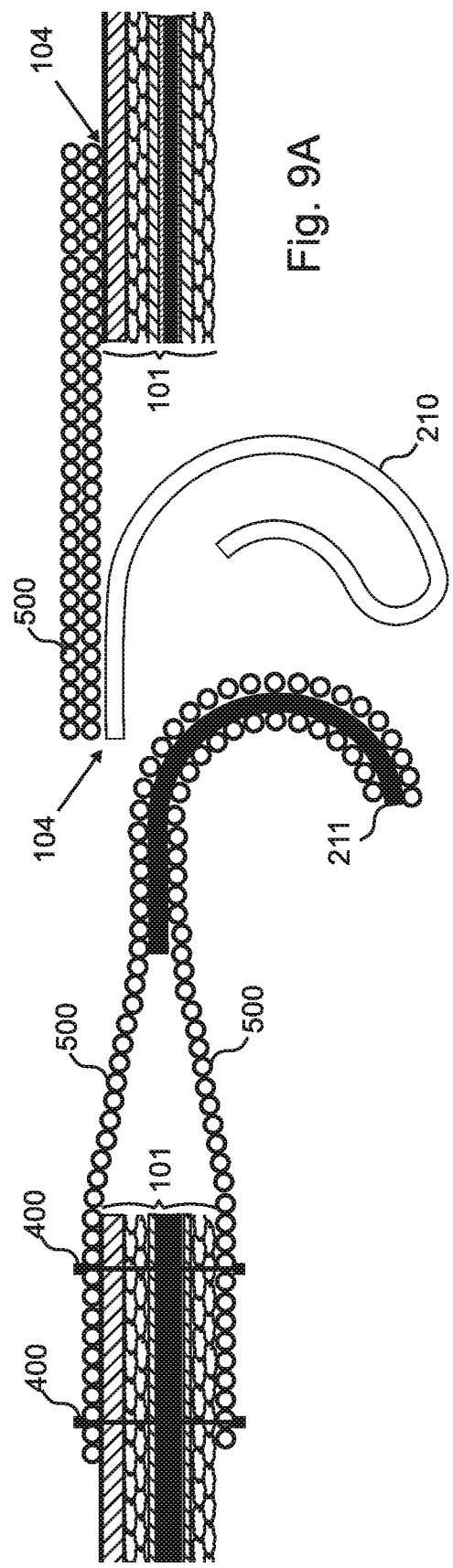
FIG. 9A illustrates a soft connection configured to join two barrier sheets according to an embodiment of the present invention, shown with the soft connectors disconnected.
Figure 9B:
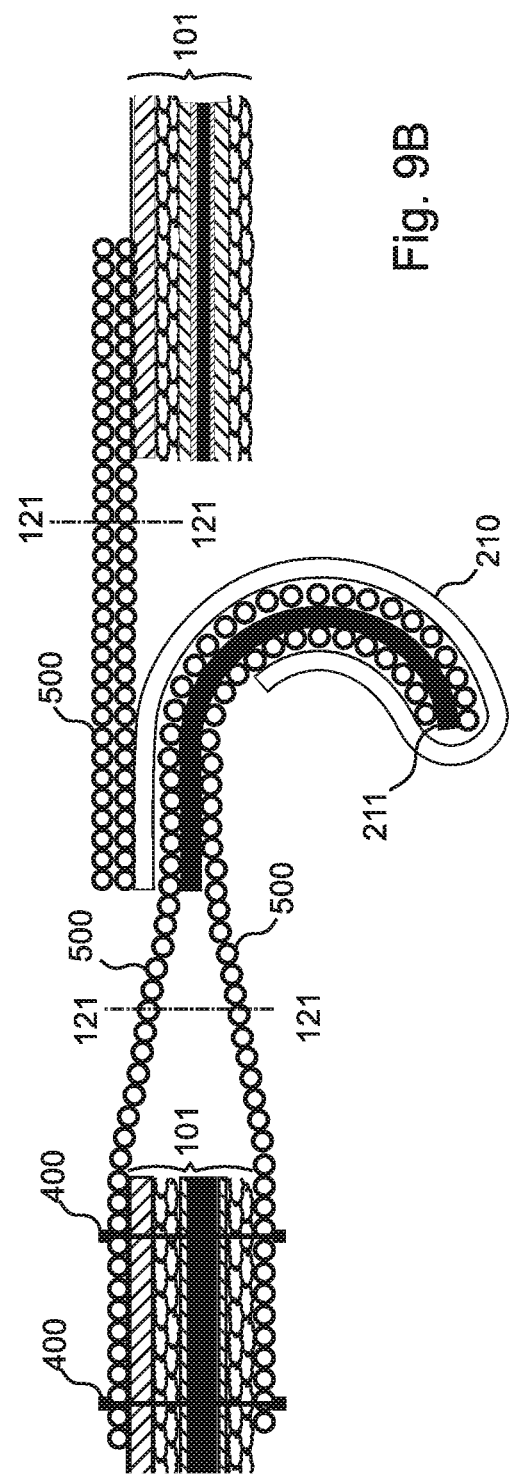
FIG. 9B illustrates the soft connection of FIG. 9A, shown with the soft connectors connected.

With reference to FIGS. 9A through 9C, in embodiments an EM shielding system comprises a plurality of sections of the disclosed EM shield laminate 101, which can be assembled together and disassembled as needed. Some of these embodiments comprise soft connectors 210, 211 that can be used to seal sections of the EM shield laminate 101 to each other, and which can also provide seals around doors 132, 133 and access panels 134 that can be repeatedly opened and closed. In some of these embodiments, the soft connections 210, 211 can be assembled quickly and without use of special tools. FIG. 9A illustrates an embodiment shown with the soft connectors 210, 211 disconnected from each other, while FIG. 9B illustrates the same embodiment with the soft connectors 210, 211 shown as being connected. FIG. 9C illustrates simplified shapes of some doorways and access panels, such as a continuous doorway or pass-through port 132, a doorway with no threshold 133, and a duct connector 134. Various embodiments form soft connections such as molded double convolute rings 210, 211 having shielding 500 on one convolute 211 combined with a matching convolute 210 that provides a mechanical connection.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications without departing from the spirit thereof. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

I claim:

1. An electromagnetic barrier comprising:
a first textile support layer;
a first conductive layer laminated by an adhesive to the first textile support layer; and
a second conductive layer;
the electromagnetic barrier being able to attenuate electromagnetic energy by a factor of at least 20 dB over a frequency range of 30 Hz to 30 GHz;
the electromagnetic barrier being flexible and foldable, whereby the electromagnetic barrier is able to retain at least 90% of its electromagnetic suppression over the full range of frequencies from 30 Hz to 30 GHz after being flexed and folded at least 10 times, where each repetition of flexing and folding includes folding the barrier system into at least five stacked, abutting layers and then unfolding the barrier system again into a single layer.

2. The electromagnetic barrier of claim 1, wherein the first textile support layer has an ASTM value of at least 10 lbf/inch of tensile strength with less than 30% elongation at break.

3. The electromagnetic barrier of claim 1, wherein the first textile support layer includes polypropylene slit tape yarn.

4. The electromagnetic barrier of claim 1, wherein the first conductive layer is a metallic layer deposited onto a polymer film substrate.

5. The electromagnetic barrier of any of claim 1, wherein the first conductive layer is a metal foil layer.

6. The electromagnetic barrier of claim 5, wherein the foil layer has a thickness between 6 microns and 60 microns.

7. The electromagnetic barrier of claim 5, wherein the foil layer has a thickness between 25 microns and 40 microns.

8. The electromagnetic barrier of claim 1, wherein the electromagnetic barrier comprises a second textile support layer laminated to a second side of the first conductive layer.

9. The electromagnetic barrier of claim 1, wherein the first conductive layer is substantially opaque to all visible and infrared radiation.

10. The electromagnetic barrier of any of claim 1, wherein the second conductive layer is a layer of conductive particles encapsulated as filler within an elastomeric layer.

11. The electromagnetic barrier of claim 10, wherein the conductive particles include at least one of iron oxide particles graphite particles, ferrite particles, and conductive carbon black particles.

12. The electromagnetic barrier of claim 10, wherein the conductive particles are present in the elastomeric layer at a loading of between 5% and 45% of dry film.

13. The electromagnetic barrier of any of claim 1, wherein the first conductive layer is a metallic mesh layer.

14. The electromagnetic barrier of claim 1, wherein the first conductive layer is a first layer of metallization deposited onto a textile layer.

15. The electromagnetic barrier of claim 14, wherein the textile layer is the first support textile layer.

16. The electromagnetic barrier of claim 14, wherein the first layer of metallization is deposited onto the textile layer by electroless plating.

17. The electromagnetic barrier of claim 1, wherein the first conductive layer comprises conductive fibers that are woven in at least one direction into a textile layer.

18. The electromagnetic barrier of claim 1, wherein the second conductive layer is a second layer of metallization applied to a polymer film.

19. The electromagnetic barrier of claim 1, wherein the second conductive layer is substantially opaque to all visible and infrared radiation.

20. The electromagnetic barrier of claim 1, wherein the second conductive layer is separable from the first conductive layer.

21. The electromagnetic barrier of claim 1, further comprising a moisture resistant phenolic primer layer between the first conductive layer and the support textile layer.

22. The electromagnetic barrier of claim 1, further comprising a topcoat layer applied to at least one outer face of the electromagnetic barrier, the topcoat layer being configured to protect the electromagnetic barrier from degradation from exposure to UV radiation.

23. The electromagnetic barrier of claim 22, wherein the topcoat layer is configured to limit color changes of the electromagnetic barrier to less than 5 delta E after 10 days of exposure to xenon light as determined according to ASTM or Mil Std 810.

24. The electromagnetic barrier of claim 1, wherein the electromagnetic barrier includes at least one of a lanyard and webbing attached to a rear surface thereof and configured for attaching the electromagnetic barrier to a surrounding structure.

25. The electromagnetic barrier of claim 24, wherein said lanyard and/or webbing extends through a penetration in the metal foil layer, said penetration being covered by a conductive patch installed on a rear surface of the electromagnetic barrier.

26. The electromagnetic barrier of claim 1, further comprising a thermal insulation layer.

27. An electromagnetic barrier system comprising a pair of barrier sections, each of the barrier sections being an electromagnetic barrier according to claim 1, the pair of barrier sections being joined by a seam.

28. The electromagnetic barrier system of claim 27, wherein the seam is formed by sewing.

29. The electromagnetic barrier system of claim 27, wherein the seam is formed separately for the first textile support layers of the barrier sections and the first conductive layers of the barrier sections.

30. The electromagnetic barrier system of claim 27, wherein at least one of the seams is an overlapping seam.

31. The electromagnetic barrier system of claim 27, wherein at least one of the seams is a butted seam that is covered by at least one of:
a metallized textile tape that is attached over the seam by an adhesive; and
a layer of conductive particles encapsulated as filler within an elastomeric layer that extends over the seam.

32. The electromagnetic barrier system of claim 27, wherein the pair of barrier sections are configured for joining to each other by soft connections formed by molded double convolute rings having shielding on one convolute combined with a matching convolute that provides a mechanical connection.

\* \* \* \* \*